(12) United States Patent
Kim et al.

(10) Patent No.: US 11,672,130 B2
(45) Date of Patent: Jun. 6, 2023

(54) SEMICONDUCTOR DEVICE AND METHOD OF FORMING THE SAME

(71) Applicant: Samsung Electronics Co., Ltd., Suwon-si (KR)

(72) Inventors: Jonguk Kim, Yongin-si (KR); Dongsung Choi, Hwaseong-si (KR); Kwangmin Park, Seoul (KR); Jaeho Jung, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 356 days.

(21) Appl. No.: 17/032,571

(22) Filed: Sep. 25, 2020

(65) Prior Publication Data

US 2021/0151506 A1 May 20, 2021

(30) Foreign Application Priority Data

Nov. 18, 2019 (KR) .......................... 10-2019-0147360

(51) Int. Cl.
*H01L 27/24* (2006.01)
*H01L 45/00* (2006.01)

(52) U.S. Cl.
CPC ...... *H01L 27/2481* (2013.01); *H01L 27/2427* (2013.01); *H01L 45/06* (2013.01); *H01L 45/1233* (2013.01); *H01L 45/143* (2013.01); *H01L 45/144* (2013.01); *H01L 45/1675* (2013.01)

(58) Field of Classification Search
CPC .................................................... H01L 45/143
See application file for complete search history.

(56) References Cited

U.S. PATENT DOCUMENTS

| 9,741,764 | B1 * | 8/2017 | Terai ................. H01L 27/11582 |
| 10,177,198 | B2 * | 1/2019 | Hu .......................... H01L 45/12 |
| 10,224,479 | B2 | 3/2019 | Chan et al. |
| 2014/0094038 | A1 | 4/2014 | Haverkamp et al. |
| 2016/0218282 | A1 * | 7/2016 | Chan ....................... H01L 45/12 |
| 2018/0144795 | A1 | 5/2018 | Hu et al. |
| 2018/0166629 | A1 | 6/2018 | Chan et al. |
| 2022/0140003 | A1 * | 5/2022 | Yang ................... H01L 27/2427 |
| | | | 257/4 |

FOREIGN PATENT DOCUMENTS

JP        H 9213653 A        8/1997

\* cited by examiner

*Primary Examiner* — Mounir S Amer
(74) *Attorney, Agent, or Firm* — Harness, Dickey & Pierce, P.L.C.

(57) ABSTRACT

A semiconductor device and a method of forming the same are provided. The semiconductor device including a first conductive line on a substrate, memory cell structures stacked on the first conductive line, a second conductive line between the memory cell structures; and a third conductive line on the memory cell structures may be provided. Each of the plurality of memory cell structures includes a data storage material pattern, a switching material pattern, and a plurality of electrode patterns, at least one of the electrode patterns includes at least one of carbon material layer or a carbon-containing material layer, and the at least one of the electrode patterns includes a first region doped with a nitrogen and a second region that is not doped with the nitrogen, or is doped with the nitrogen at a first concentration lower than a second concentration of the nitrogen in the first region.

20 Claims, 32 Drawing Sheets

SEMICONDUCTOR DEVICE AND METHOD OF FORMING THE SAME

CROSS-REFERENCE TO RELATED APPLICATION(S)

This application claims priority under 35 USC 119(a) to Korean Patent Application No. 10-2019-0147360 filed on Nov. 18, 2019 in the Korean Intellectual Property Office, the entire disclosure of which is incorporated herein by reference for all purposes.

BACKGROUND

The present inventive concepts relate to semiconductor devices and/or methods of forming the same, and more particularly, to semiconductor devices including a data storage material pattern and/or methods of forming the same.

As semiconductor devices, such as memory devices, have become high in performance and low in terms of power consumption, next-generation memory devices such as PRAM and RRAM are being developed. In the case of such next-generation memory devices, resistance values may change depending on current or voltage, and thus such next-generation memory devices may include a data storage material capable of maintaining resistance values even when a current or voltage supply is interrupted.

SUMMARY

An aspect of the present inventive concepts is to provide semiconductor devices including a data storage material pattern.

An aspect of the present inventive concepts is to provide methods of forming a semiconductor device including a data storage material pattern.

According to an example embodiment, a semiconductor device may include a first conductive line extending on a substrate in a first horizontal direction, the first horizontal direction being parallel to a first upper surface of the substrate, a second conductive line extending on the first conductive line in a second horizontal direction, the second horizontal direction being parallel to the first upper surface of the substrate and perpendicular to the first horizontal direction, a first memory cell structure between the first conductive line and the second conductive line, a lower interlayer insulating layer adjacent to a first side of the first memory cell structure, a lower capping layer between the first memory cell structure and the lower interlayer insulating layer, and a lower spacer between the lower capping layer and a portion of the first side of the first memory cell structure. The first intermediate electrode pattern may include a first intermediate conductive layer and a second intermediate conductive layer that are sequentially stacked. The first upper electrode pattern may include a first upper conductive layer and a second upper conductive layer that are sequentially stacked. At least one of the first lower electrode pattern, the first intermediate conductive layer, or the second upper conductive layer may include a first material layer, the first material layer including at least one of a first carbon material layer or a first carbon-containing material layer. The first material layer may include a first region doped with nitrogen and a second region that is not doped with the nitrogen or is doped with the nitrogen at a first concentration lower than a second concentration of the nitrogen in the first region.

According to an example embodiment, a semiconductor device may include a first conductive line on a substrate, a plurality of memory cell structures stacked on the first conductive line in a direction perpendicular to an upper surface of the substrate, a second conductive line between the plurality of memory cell structures, and a third conductive line on an uppermost one of the plurality of memory cell structures. Each of the plurality of memory cell structures may include a data storage material pattern, a switching material pattern, and a plurality of electrode patterns. At least one of the plurality of electrode patterns may include at least one of a first carbon material layer or a first carbon-containing material layer. The at least one of the plurality of electrode patterns may include a first region doped with a nitrogen and a second region that is not doped with the nitrogen, or is doped with the nitrogen at a first concentration lower than a second concentration of the nitrogen in the first region.

According to an example embodiment, a semiconductor device may include a first conductive line on a substrate, a memory cell structure on the first conductive line, a second conductive line on the memory cell structure, an interlayer insulating layer adjacent to a side of the memory cell structure, a capping layer between the memory cell structure and the interlayer insulating layer and covering a lower surface of the interlayer insulating layer, and a spacer between the capping layer and a portion of the first side of the memory cell structure. The memory cell structure may include a data storage material pattern, a switching material pattern, and a plurality of electrode patterns. At least one of the plurality of electrode patterns may include at least one of a carbon material layer or a carbon-containing material layer. The at least one of the plurality of electrode patterns may include a first region doped with an impurity element and a second region that is not doped with the impurity element, or is doped with the impurity element at a first concentration lower than a second concentration of the impurity element in the first region.

According to an example embodiment, a method of forming a semiconductor device may include forming first conductive lines on a substrate, forming first gap-fill patterns between the first conductive lines, forming line structures on the first conductive lines and the first gap-fill patterns, forming a first lower interlayer insulating layer filling between the line structures, forming second conductive lines on the line structures and the first lower interlayer insulating layer, and forming memory cell structures below the second conductive lines, using the line structures. Each of the memory cell structures may include a first lower electrode pattern, a first switching material pattern, a first intermediate electrode pattern, a first data storage material pattern, and a first upper electrode pattern that are sequentially stacked. The first upper electrode pattern may include a first upper conductive layer and a second upper conductive layer that are sequentially stacked. The second upper conductive layer may include a first material layer. The first material layer may include at least one of a first carbon material layer or a first carbon-containing material layer. The second upper conductive layer may include a first region doped with nitrogen and a second region that is not doped with nitrogen or is doped with the nitrogen at a first concentration lower than a second concentration of the nitrogen in the first region.

According to an example embodiment, a method of forming a semiconductor device may include forming a conductive line on a substrate, forming a gap-fill pattern adjacent to a first side of the conductive line, forming a memory cell structure on the conductive line, and forming an interlayer insulating layer adjacent to a second side of the memory cell structure. The memory cell structure may include a lower electrode pattern, a switching material pattern, an intermediate electrode pattern, a data storage material pattern, and an upper electrode pattern that are sequentially stacked. The intermediate electrode pattern may include a first intermediate conductive layer and a second intermediate conductive layer that are sequentially stacked. The upper electrode pattern may include a first upper conductive layer and a second upper conductive layer that are sequentially stacked. At least one of the lower electrode pattern, the first intermediate conductive layer and the second upper conductive layer may include a first material layer. The first material layer may include at least one of a first carbon material layer or a first carbon-containing material layer. The first material layer may include a first region doped with nitrogen and a second region that is not doped with nitrogen or is doped with the nitrogen at a first concentration lower than a second concentration of the nitrogen in the first region.

BRIEF DESCRIPTION OF DRAWINGS

The above and other aspects, features, and advantages of the present inventive concepts will be more clearly understood from the following detailed description, taken in conjunction with the accompanying drawings. The accompanying drawings represent non-limiting, example embodiments as described herein.

DETAILED DESCRIPTION

Figure 1:
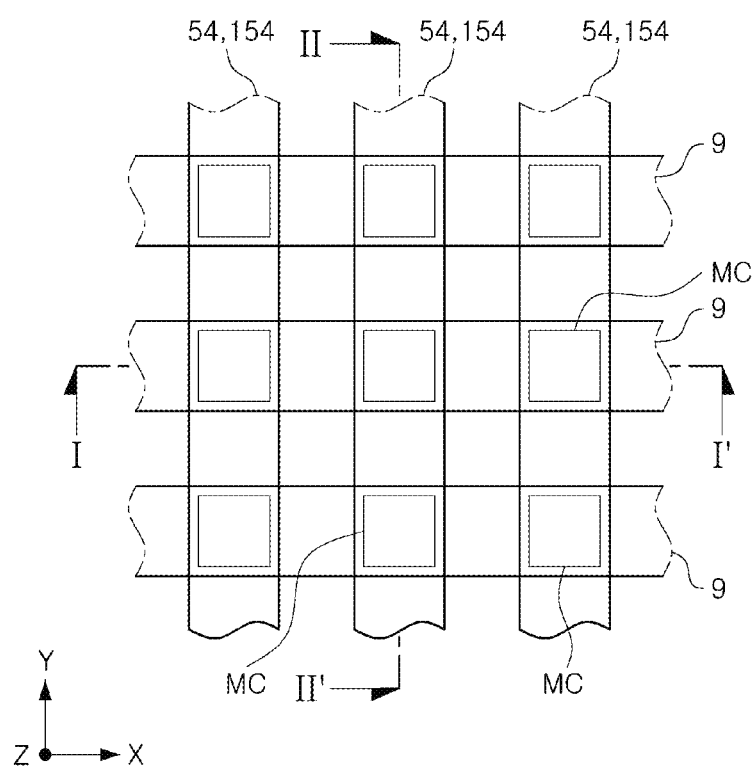
FIG. 1 is a plan view illustrating a semiconductor device according to an example embodiment.
Figure 2:
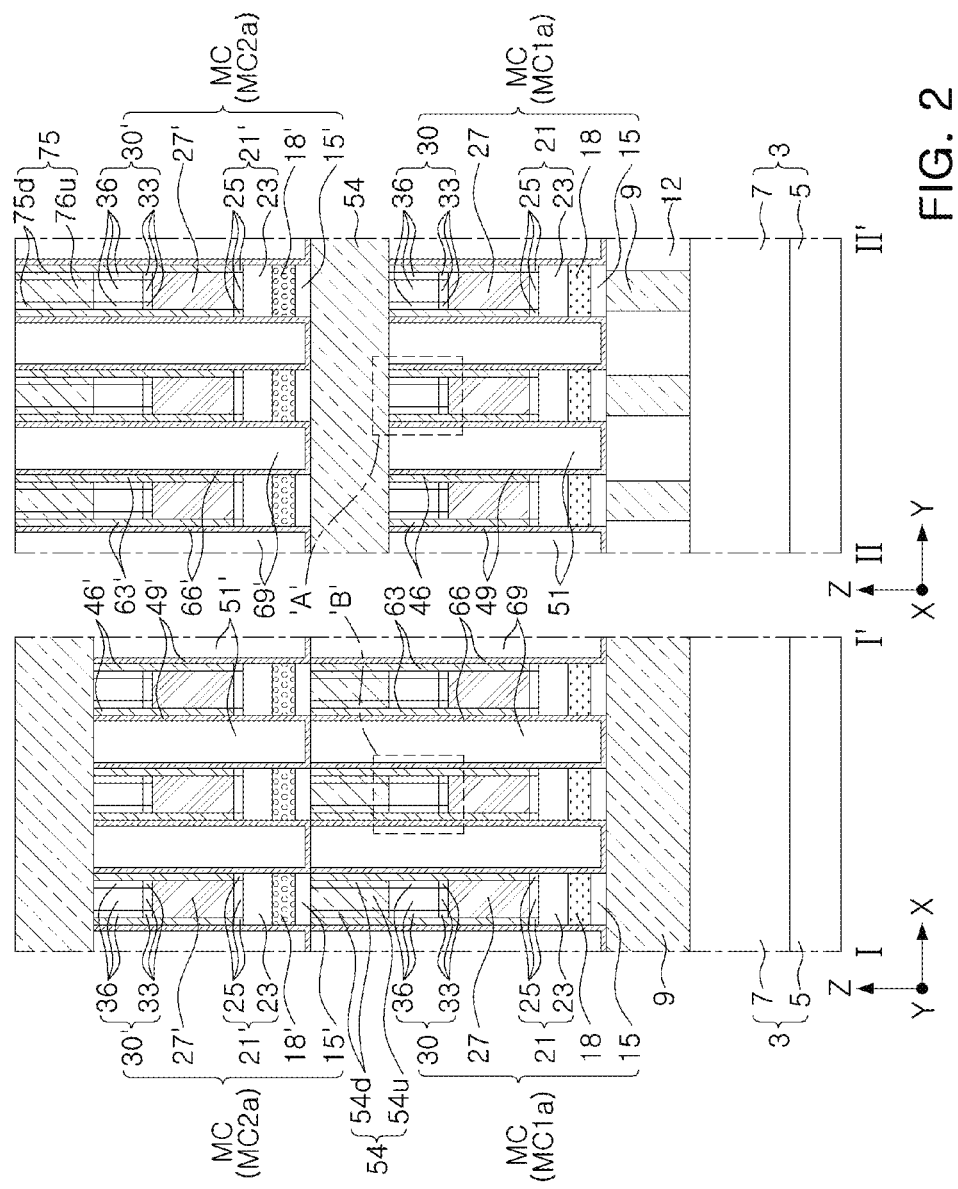
FIG. 2 is a cross-sectional view illustrating a semiconductor device according to an example embodiment.
Figure 3A:
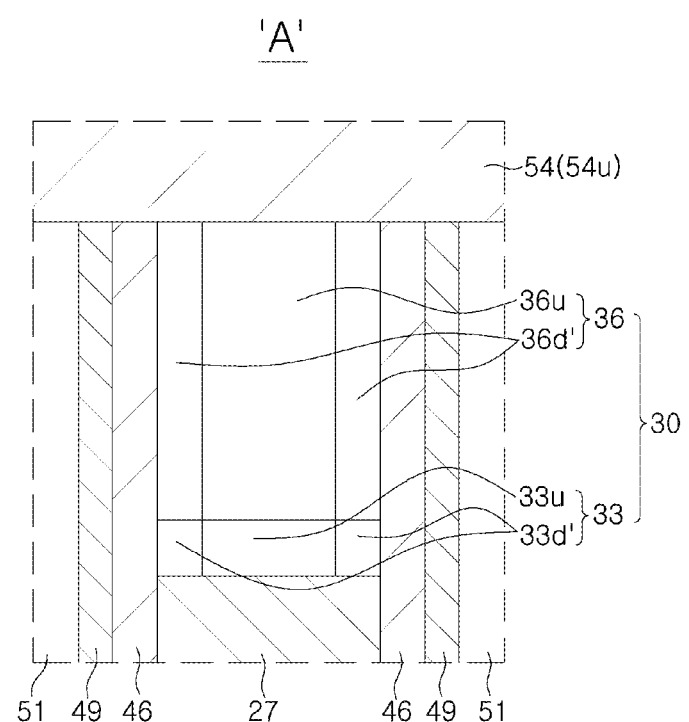
FIGS. 3A and 3B are partially enlarged views of a portion of FIG. 2.
Figure 3B:
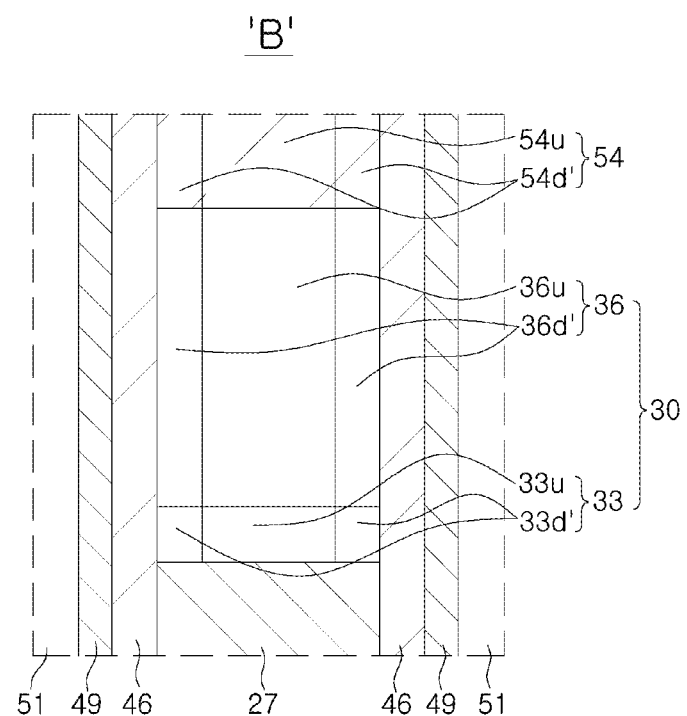

A semiconductor device according to an example embodiment will be described with reference to FIGS. 1, 2, 3A and 3B. FIG. 1 is a plan view illustrating some components of a semiconductor device according to an example embodiment, FIG. 2 is a cross-sectional view illustrating regions taken along lines I-I' and II-IP of FIG. 1. FIG. 3A is an enlarged view of a portion indicated by 'A' of FIG. 2, and FIG. 3B is an enlarged view of a portion indicated by 'B' of FIG. 2.

Referring to FIGS. 1 and 2, a lower structure 3 may be provided. The lower structure 3 may include a substrate 5 and a lower region 7 on the substrate 5. The substrate 5 may be a semiconductor substrate. The lower region 7 may be a circuit region in which circuit elements are formed.

First conductive lines 9 may be disposed on the lower structure 3. The first conductive lines 9 may extend on the substrate 5 in a first horizontal direction X parallel to the upper surface of the substrate 5.

Gap-fill patterns 12 may be disposed between the first conductive lines 9. The gap-fill patterns 12 may be formed of an insulating material such as silicon oxide or a low-k dielectric.

Second conductive lines 54 may be disposed on the first conductive lines 9, and may extend in a second horizontal direction Y perpendicular to the first horizontal direction X. The second horizontal direction Y may be parallel to the upper surface of the substrate 5. The second conductive lines 54 may overlap the first conductive lines 9 and the gap-fill patterns 12.

A plurality of first memory cell structures MC1a may be disposed between the first conductive lines 9 and the second conductive lines 54.

A first lower interlayer insulating layer 51 may be disposed between the gap-fill patterns 12 and the second conductive lines 54. On the first conductive lines 9, a second lower interlayer insulating layer 69 may be interposed between the plurality of first memory cell structures MC1a and to extend to between the second conductive lines 54.

The first lower interlayer insulating layer 51 and the second lower interlayer insulating layer 69 may be formed of an insulating material such as silicon oxide or a low-k dielectric.

A first lower capping layer 49 may be disposed between the first lower interlayer insulating layer 51 and the first memory cell structures MC1a, and may extend to between a lower surface of the first lower interlayer insulating layer 51 and the gap-fill patterns 12. A second lower capping layer 66 may be disposed between the second lower interlayer insulating layer 69 and the first memory cell structures MC1a, and may extend to between a lower surface of the second lower interlayer insulating layer 69 and the first conductive lines 9. The first lower capping layer 49 may be disposed below the first conductive lines 54, and the second lower capping layer 66 may extend on the sides of the second conductive lines 54. The first and second lower capping layers 49 and 66 may be formed of an insulating material such as SiN, SiO, SiC, SiCN, SiON, or SiBN.

A first lower spacer 46 may be disposed between the first lower interlayer insulating layer 51 and the first memory cell structures MC1a. A second lower spacer 63 may be disposed between the memory cell structures MC1a. The first lower spacer 46 may be disposed below the second conductive lines 54, and the second lower spacer 63 may extend onto side surfaces of the second conductive lines 54.

The first and second lower spacers 46 and 63 may be formed of an insulating material such as SiN, SiO, SiC, SiCN, SiON, or SiBN.

Each of the first memory cell structures MC1a may include a first lower electrode pattern 15, a first lower pattern 18, a first intermediate electrode pattern 21, a first upper pattern 27, and a first upper electrode pattern 30, which are sequentially stacked.

In an example embodiment, the first lower pattern 18 may be a switching material pattern, and the first upper pattern 27 may be a data storage material pattern. Hereinafter, for convenience of description, the first lower pattern 18 is referred to as a 'first switching material pattern', and the first upper pattern 27 is referred to as a 'first data storage material pattern'.

The first switching material pattern 18 may be formed of a material having switching device characteristics. For example, the first switching material pattern 18 may function as an ovonic threshold switching device. The first switching material pattern 18 may be formed of a chalcogenide-based material different from a chalcogenide-based material of the first data storage material pattern 27. For example, the first data storage material pattern 27 may be a phase change memory material (e.g., an alloy of Ge, Sb and/or Te) that is phase changeable from crystalline to amorphous, or from amorphous to crystalline during operation of a semiconductor device, and the first switching material pattern 18 may be formed of a chalcogenide-based ovonic threshold switching material capable of maintaining an amorphous phase during operation of the semiconductor device. For example, the first switching material pattern 18 may include an alloy material including at least two or more of an As element, an S element, an Se element, a Te element, or a Ge element, or may include an additional element (e.g., a Si or N element) that is capable of maintaining a noncrystalline phase at a relatively higher temperature, in addition to the alloy material. In an example embodiment, the first switching material pattern 18 may be formed of any one of an alloy material including Te, As, Ge, and Si, an alloy material including Ge, Te, and Pb, an alloy material including Ge, Se, and Te, an alloy material including Al, As and Te, an alloy material including Se, As, Ge, and Si, an alloy material including Se, As, Ge, and C, an alloy material including Se, Te, Ge, and Si, an alloy material including Ge, Sb, Te and Se, an alloy material including Ge, Bi, Te and Se, an alloy material including Ge, As, Sb and Se, an alloy material including Ge, As, Bi and Te, or an alloy material including Ge, As, Bi, and Se.

In an example embodiment, the first data storage material pattern 27 may be formed of a phase change material such as a chalcogenide material including Ge, Sb, and/or Te. In an example embodiment, the first data storage material pattern 27 may also be formed of a phase change material including at least one of Te or Se and at least one of Ge, Sb, Bi, Pb, Sn, As, S, Si, P, O, N, or In.

In another example, the first data storage material pattern 27 may be formed by a data storage material that may store data in another manner, instead of the phase change material.

In an example, the first lower electrode pattern 15 may include at least one of a carbon material layer or a carbon-containing material layer. The carbon-containing material layer may be a material layer including carbon and metal. For example, the carbon-containing material layer may include carbon and metal based materials. For example, the carbon-containing material layer may be formed of a conductive material including metal (e.g., W or Ti) and a carbon element. For example, the carbon-containing material layer may include a metal-carbon alloy material (e.g., tungsten carbide (WC) or titanium carbide (TiC)). In an example embodiment, the metal of the metal-carbon alloy material is not limited to W and Ti described above, but may include another metal material (e.g., Ta, or Co) that is capable of forming an alloy with carbon (C).

In the following, the carbon-containing material layer may be understood to include a conductive material including carbon and metal, as described above, even if there is no separate description for the carbon-containing material layer.

The first intermediate electrode pattern 21 may include a first intermediate conductive layer 23 and a second intermediate conductive layer 25 that are sequentially stacked. The second intermediate conductive layer 25 may have a thickness less than a thickness of the first intermediate conductive layer 23.

The first intermediate conductive layer 23 may be formed of a carbon material layer or a carbon-containing material layer. The second intermediate conductive layer 25 may include metal such as tungsten.

The first upper electrode pattern 30 may include a first upper conductive layer 33 and a second upper conductive layer 36 that are sequentially stacked. The second upper conductive layer 36 may have a thickness greater than the thickness of the first upper conductive layer 33. The first upper conductive layer 33 may include metal such as tungsten. The second upper conductive layer 36 may include a carbon material layer or a carbon-containing material layer.

The first lower spacer 46 and the second lower spacer 63 may be disposed on an upper surface of the second intermediate conductive layer 25 of the first intermediate electrode pattern 21. The first lower spacer 46 and the second lower spacer 63 may constitute lower spacers 46 and 63. The lower spacers 46 and 63 may surround side surfaces of the first data storage material pattern 27 and the upper electrode pattern 30 that are sequentially stacked, on the upper surface of the second intermediate conductive layer 25.

A plurality of second memory cell structures MC2a may be disposed on the second conductive lines 54. Each of the second memory cell structures MC2a may include a second lower electrode pattern 15', a second switching material pattern 18', a second intermediate electrode pattern 21', and a second upper pattern 27' and a second upper electrode pattern 30', sequentially stacked.

The second memory cell structures MC2a may be formed of the same or substantially similar structure and material as those of the first memory cell structures MC1a. Accordingly, the second lower electrode pattern 15', the second switching material pattern 18', the second intermediate electrode pattern 21', and the second upper portion 27' and the second upper electrode pattern 30' of the second memory cell structures MC2a may correspond to the first lower electrode pattern 15, the first switching material pattern 18, the first intermediate electrode pattern 21, and the first data storage material pattern 27 and the first upper electrode pattern 30 of the first memory cell structures MC1a, respectively.

The second memory cell structures MC2a and the first memory cell structures MC1a may form memory cell structures MC. Therefore, the memory cell structures MC may include the first memory cell structures MC1a and the second memory cell structures MC2a that are arranged in the vertical direction Z.

A first upper interlayer insulating layer 51' may be disposed between the second lower interlayer insulating layer 69 and the third conductive lines 75. A second upper interlayer insulating layer 69' may be interposed between the second memory cell structures MC2a, on the second conductive lines 54, and may extend between the third conductive lines 75. The first upper interlayer insulating layer 51' and the second upper interlayer insulating layer 69' may be formed of an insulating material such as silicon oxide or a low-k dielectric.

A first upper capping layer 49' may be disposed between the first upper interlayer insulating layer 51' and the second memory cell structures MC2a, and may extend between a lower surface of the first upper interlayer insulating layer 51' and the second lower interlayer insulating layer 69.

A second upper capping layer 66' may be disposed between the second upper interlayer insulating layer 69' and the second memory cell structures MC2a, and may extend between a lower surface of the second upper interlayer insulating layer 69' and the second conductive lines 54. The first and second upper capping layers 49' and 66' may be formed of an insulating material such as SiN, SiO, SiC, SiCN, SiON or SiBN.

Upper spacers 46' and 63' may be disposed on an upper surface of the second intermediate electrode pattern 21'. The upper spacers 46' and 63' may be disposed on the upper surface of the second intermediate electrode pattern 21' to surround sides of the second data storage material pattern 27' and the second upper electrode pattern 30' that are sequentially stacked. The upper spacers (46' and 63') may include a first upper spacer 46' between the first upper interlayer insulating layer 51' and the second memory cell structures MC2a, and a second upper spacer 63' between the second upper interlayer insulating layer 69' and the second memory cell structures MC2a. The first and second upper spacers 46' and 63' may be formed of an insulating material such as SiN, SiO, SiC, SiCN, SiON, or SiBN.

In an example, the respective second conductive lines 54 may include a first region 54d and a second region 54u. In each of the second conductive lines 54, the first region 54d may be a region in which an impurity element is doped in a direction from the side of each of the second conductive lines 54 to the central portion of each of the second conductive lines 54.

In an example, the impurity element may be a nitrogen element.

In an example, in the respective second conductive lines 54, the second region 54u may be a region in which the impurity element is not doped.

In another example, in the respective second conductive lines 54, the second region 54u may be spaced apart from the side of each of the second conductive lines 54 and may be a region that is doped with the impurity element by diffusing the impurity element in a direction from the first region 54d of each of the second conductive lines 54 to the central portion of each of the second conductive lines 54. The concentration of the impurity element in the second region 54u may be lower than the concentration of the impurity element in the first region 54d.

In an example, each of the third conductive lines 75 may include a first region 75d corresponding to the first region 54d of each of the second conductive lines 54, and a second region 75u corresponding to the second region 54u of each of the second conductive lines 54. For example, in the respective third conductive lines 75, the first region 75d may be a region that is doped with the impurity element (e.g., nitrogen) in a direction from the side of each of the third conductive lines 75 to the central portion of each of the third conductive lines 75, and the second region 75u may be a region that is not doped with the impurity element or may be a region doped with the impurity element at a concentration lower than the doping concentration of the impurity element in the first region 75d.

In the first memory cell structures MC1a, the second upper conductive layer 36 may include a first material layer, and the first lower electrode pattern 15 and the first intermediate conductive layer 23 may include a second material layer. In an example, the first material layer of the second upper conductive layer 36 may be a first carbon material layer of which at least a portion is doped with an impurity element (e.g., nitrogen), or may be a first carbon-containing material layer of which at least a portion is doped with an impurity element (e.g., nitrogen).

In an example, the second material layer of the first lower electrode pattern 15 and the first intermediate conductive layer 23 may be a second carbon material layer that is not doped with the impurity element, or may be a second carbon-containing material layer that is not doped with the impurity element.

Next, the first upper electrode pattern 30 will be described with reference to FIGS. 3A and 3B. FIG. 3A is a partially enlarged view of portion 'A' of FIG. 2, and FIG. 3B is a partially enlarged view of portion 'B' of FIG. 2.

Referring to FIGS. 2, 3A and 3B, as described above, the first upper electrode pattern 30 may include the first upper conductive layer 33 and the second upper conductive layer 36. In an example, the first upper conductive layer 33 may include a first region $33d'$ and a second region $33u$. When the first upper conductive layer 33 includes metal (e.g., W, Ti, or Ta), the first region $33d'$ may be a region in which an impurity element (e.g., nitrogen) is doped in the first upper conductive layer 33. The second region $33u$ may be a region in which the impurity element is not doped in the first upper conductive layer 33 or may be a region in which the impurity element is doped in the first upper conductive layer 33 at a doping concentration lower than that of an impurity element in the first region $33d'$.

In an example, the second intermediate conductive layer 25 may be formed of the same or substantially similar material and structure as those of the first upper conductive layer 33. Accordingly, the second intermediate conductive layer 25, like the first upper conductive layer 33, may include regions corresponding to the first region $33d'$ and the second region $33u$ of the first upper conductive layer 33, respectively. In another example, when the first upper conductive layer 33 is formed of a metal nitride (e.g., TiN, TaN or WN) and the impurity element is a nitrogen element, the first region $33d'$ and the second region $33u$ may be visually indistinguishable or difficult to visually distinguish in the first upper conductive layer 33.

The second upper conductive layer 36 may be formed of the first material layer, and the first material layer may be a first carbon material layer of which at least a portion is doped with the impurity element or may be a first carbon-containing material layer of which at least a portion is doped with the impurity element. The impurity element may be a nitrogen element. The first material layer of the second upper conductive layer 36 may include a first region $36d'$ and a second region 36u. Thus, the first material layer of the second upper conductive layer 36 may be a carbon material layer including the first region 36d' and the second region 36u or may be a carbon-containing material layer including the first region 36d' and the second region 36u.

In the first material layer of the second upper conductive layer 36, the first region 36d' may be a region doped with the impurity element.

In an example, in the first material layer of the second upper conductive layer 36, the second region 36u may be a region that is not doped with the impurity element.

In another example, in the first material layer of the second upper conductive layer 36, the second region 36u may be a region in which the impurity element is doped at a concentration lower than a doping concentration of the impurity element in the first region 36d'. In the second upper conductive layer 36, the first region 36d' may be a region in which the impurity element is doped in a direction from the side surface of the second upper conductive layer 36 toward the central portion of the second upper conductive layer 36. In the second upper conductive layer 36, the first region 36d' may surround the second region 36u, and the second region 36u may be spaced apart from the side of the second upper conductive layer 36.

Figure 3C:
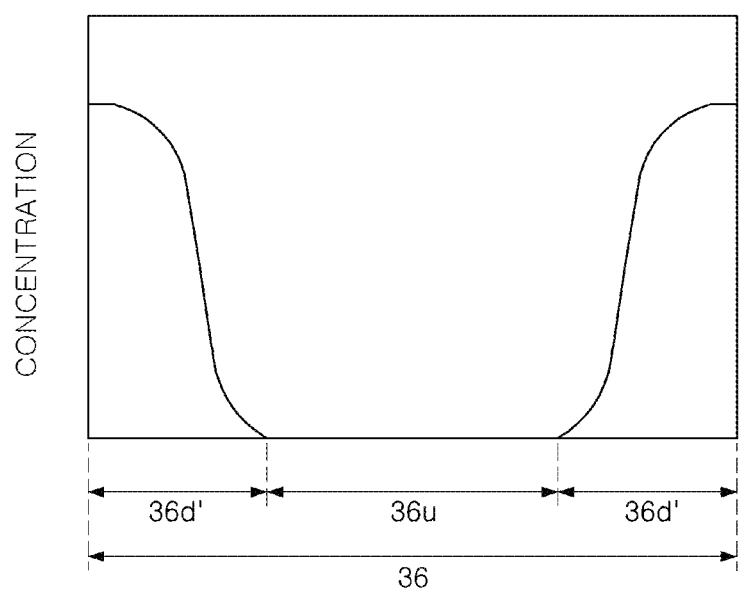
FIG. 3C is a diagram illustrating an impurity doping profile of some components of a semiconductor device according to an example embodiment.

FIG. 3C schematically illustrates a doping concentration profile of an impurity element in the second upper conductive layer 36.

FIG. 3C is a schematic diagram illustrating a doping concentration profile of the impurity element (e.g. nitrogen) in the second upper conductive layer 36.

Referring to FIG. 3C, in the first material layer of the second upper conductive layer 36, the impurity element may be doped in a direction from a side 36s of the second upper conductive layer 36 toward a central portion 36c of the second upper conductive layer 36. Thus, within the second upper conductive layer 36, in the case of the first region 36d', the concentration of the impurity element in a portion adjacent to the central portion 36c of the second upper conductive layer 36 may be higher than that of a portion thereof adjacent to the side 36s of the second upper conductive layer 36. Within the second upper conductive layer 36, the first region 36d' may have a doping profile in which the concentration of the impurity element is lowered in the direction from the side 36s of the second upper conductive layer 36 toward the central portion 36c of the second upper conductive layer 36.

In example embodiments, the first region 36d' of the second upper conductive layer 36, which may be doped with the impurity element, for example, a nitrogen element, may improve adhesion between the second upper conductive layer 36 and the first and second lower spacers 46 and 63. Thus, according to an example embodiment, defect due to delamination that may occur between the side of the second upper conductive layer 36 including the first region 36d' and the first and second lower spacers 46 and 63 may be prevented.

In an example, the second upper conductive layer 36 may have a width or diameter of a first size, and a width or diameter of the second region 36u of the second upper conductive layer 36 may be ½ of the first size or greater than ½ of the first size.

In an example, the first material layer may include the second region that is not doped with nitrogen, thereby preventing or significantly reducing the deterioration of resistive properties of the conductive layer including the first material layer. For example, the second upper conductive layer 36 is formed of the first material layer, and a portion of the second upper conductive layer 36 is formed of the second region 36u, thereby preventing or significantly reducing deterioration in the resistive properties of the second upper conductive layer 36.

Hereinafter, modified examples of the above-described semiconductor device will be described. Some components that are modified or replaced in the above-described semiconductor device will be described. Components that are not changed or same or substantial similar to those in the above-described semiconductor device may be understood from the above description, and thus will be omitted in the following description.

Figure 4:
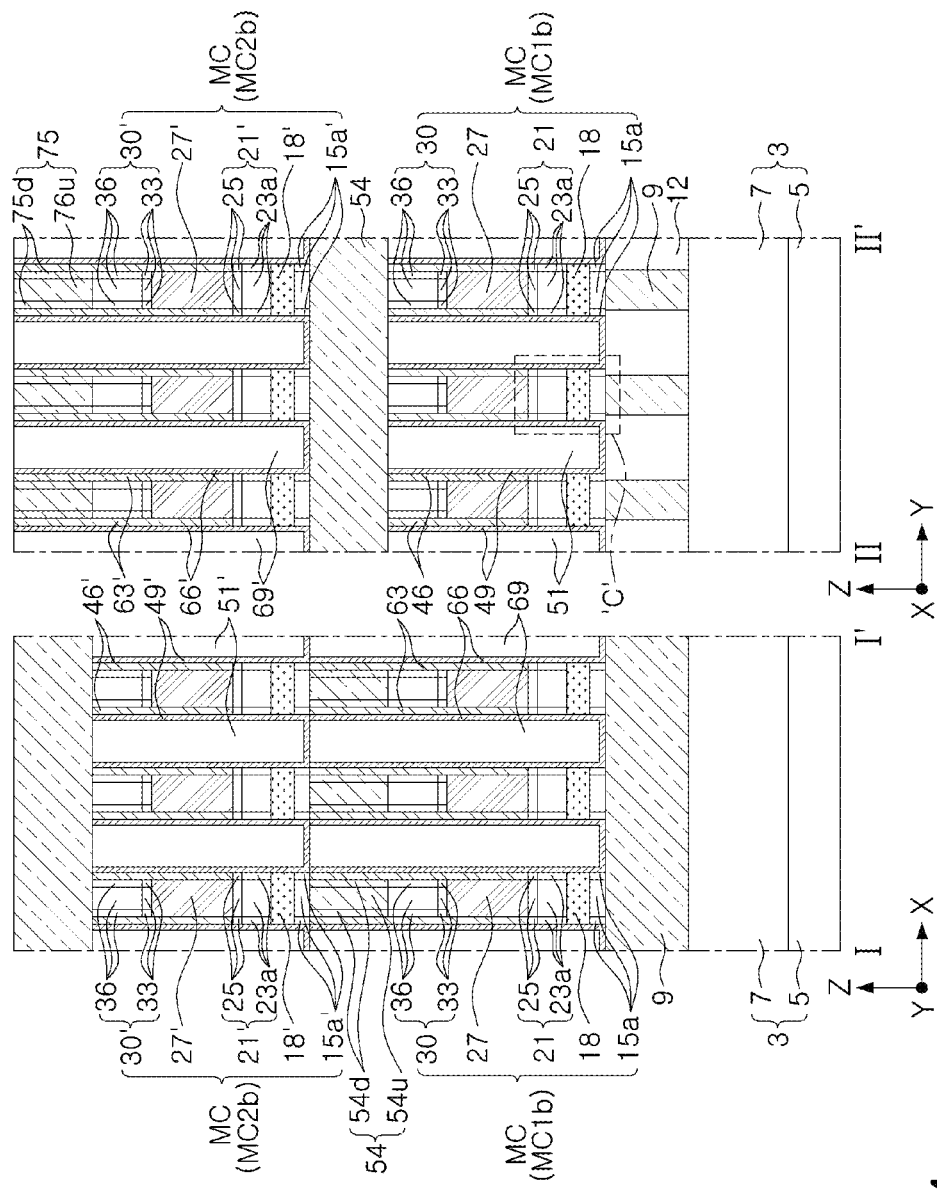
FIG. 4 is a cross-sectional view illustrating a modified example of a semiconductor device according to an example embodiment.

First, a modified example of the first and second memory cell structures MC1a and MC2a will be described with reference to FIGS. 4 and 5. FIG. 4 is a cross-sectional view illustrating regions taken along lines I-I' and II-II' of FIG. 1, and FIG. 5 is a partially enlarged view of portion "C" of FIG. 4.

Figure 5:
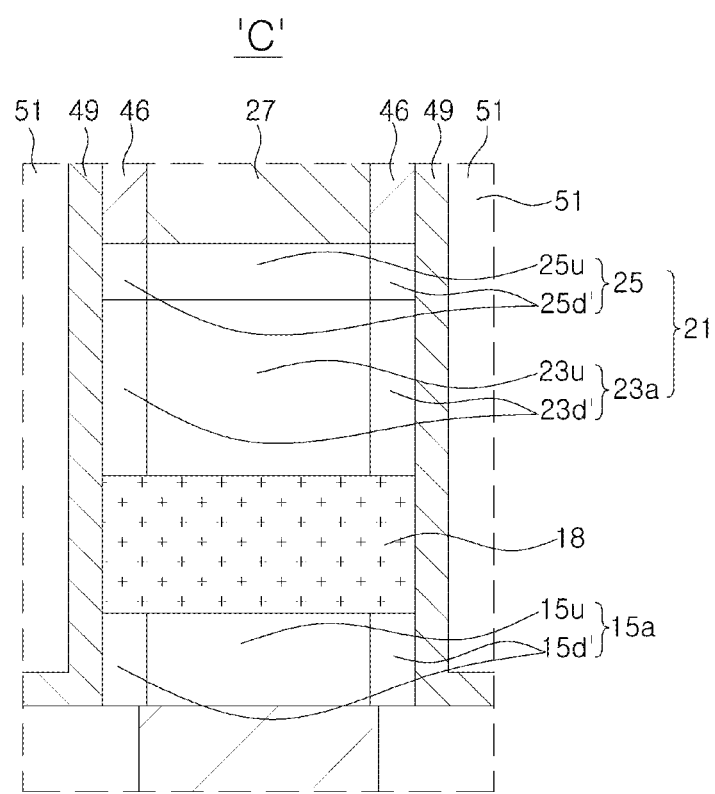
FIG. 5 is an enlarged partial view of a portion of FIG. 4.

Referring to FIGS. 4 and 5 in a modified example, the first lower electrode pattern 15 (see FIG. 2) may be replaced with a first lower electrode pattern 15a including a first region 15d', and the first intermediate conductive layer 23 (see FIG. 2) described above may be replaced with the first intermediate conductive layer 23a including the first region 23d'.

The first lower electrode pattern 15a and the first intermediate conductive layer 23a may be formed of the same or substantially similar material and the same or substantially similar structure as those of the second upper conductive layer (36 of FIGS. 3A and 3B) described above. For example, the first lower electrode pattern 15a may include a first region 15d' and a second region 15u, and the first region 15d' and the second region 15u of the first lower electrode pattern 15a may have the same or substantially similar material and/or the same or substantially similar structure the first region (36d' in FIGS. 3A and 3B) and the second region (36u in FIGS. 3A and 3B) of the second upper conductive layer (see 36 in FIGS. 3A and 3B) described above, respectively. Further, the first intermediate conductive layer 23a may include a first region 23d' and a second region 23u, and the first region 23d' and the second region 23u of the first intermediate conductive layer 23a may have the same or substantially similar material and/or the same or substantially similar structure the first region (36d' in FIGS. 3A and 3B) and the second region (36u in FIGS. 3A and 3B) of the second upper conductive layer (36 in FIGS. 3A and 3B) described above, respectively.

First memory cell structures MC1b may be provided to include the first lower electrode pattern 15a that includes the first region 15d' and the second region 15u, and the first intermediate conductive layer 23a that includes the first region 23d' and the second region 23u. Accordingly, in the first memory cell structures MC1b, the first lower electrode pattern 15, the first intermediate conductive layer 23, and the second upper conductive layer 36 may be formed of the first material layer as described above with reference to FIGS. 3A and 3B. For example, the first material layer may be formed of a carbon material layer doped with an impurity element, for example, partially doped with an impurity element (e.g., nitrogen), or a carbon-containing material layer partially doped with the impurity element.

The first memory cell structures MC1a of FIG. 2 and the second memory cell structures MC2a of FIG. 2 may be formed of the same or substantially similar material and the same or substantially similar structure. Accordingly, the second memory cell structures MC2a of FIG. 2 described above may be replaced by second memory cell structures MC2b including a second lower electrode pattern 15a' and a first intermediate conductive layer 23a of a second intermediate electrode pattern 21', corresponding to the first lower electrode pattern 15a of FIG. 2 and the first intermediate conductive layer 23a of the first intermediate electrode pattern 21 of FIG. 2, respectively.

In the above-described first memory cell structures MC1a of FIG. 2 and MC1b of FIG. 4, the second intermediate conductive layer 25 of FIGS. 2 to 5 may include a first region (25d' of FIG. 5) and a second region (25u of FIG. 5). In the second intermediate conductive layer 25 of FIGS. 2 to 5, the first region 25d' of FIG. 5 and the second region 25u of FIG. 5 may have the same or substantially similar material and/or the same or substantially similar structure the first region 33d' of FIGS. 3A and 3B and the second region (33u of FIGS. 3A and 3B) of the first upper conductive layer 33 of FIGS. 3A and 3B, respectively. Thus, since the second intermediate conductive layer 25 may be formed of the same or substantially similar material and the same or substantially similar structure as those of the first upper conductive layer (33 of FIGS. 3A and 3B), detailed descriptions of the first region (25d' in FIG. 5) and the second region (25u in FIG. 5) of the second intermediate conductive layer 25 will be omitted.

Figure 6:
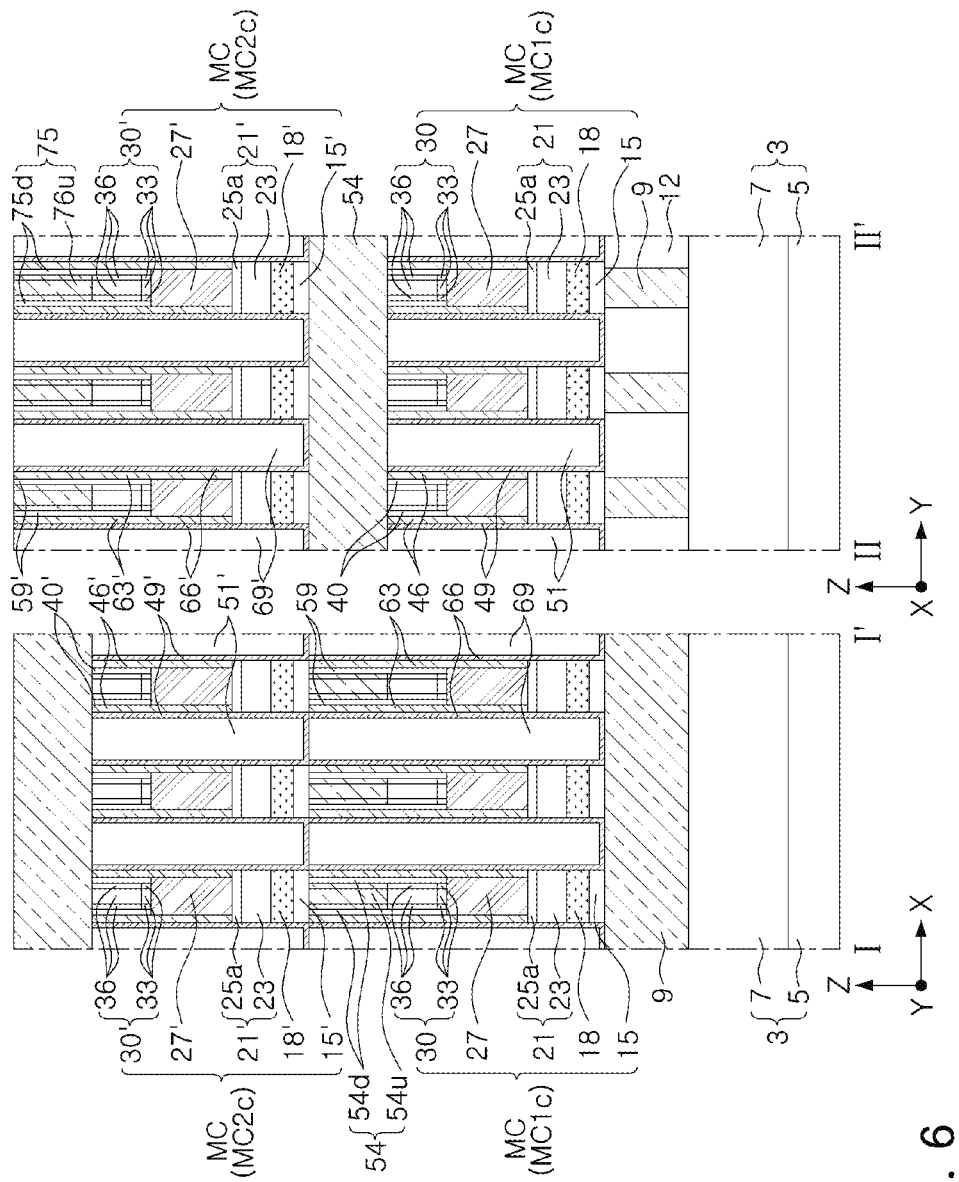
FIG. 6 is a cross-sectional view illustrating a modified example of a semiconductor device according to an example embodiment.
Figure 7:
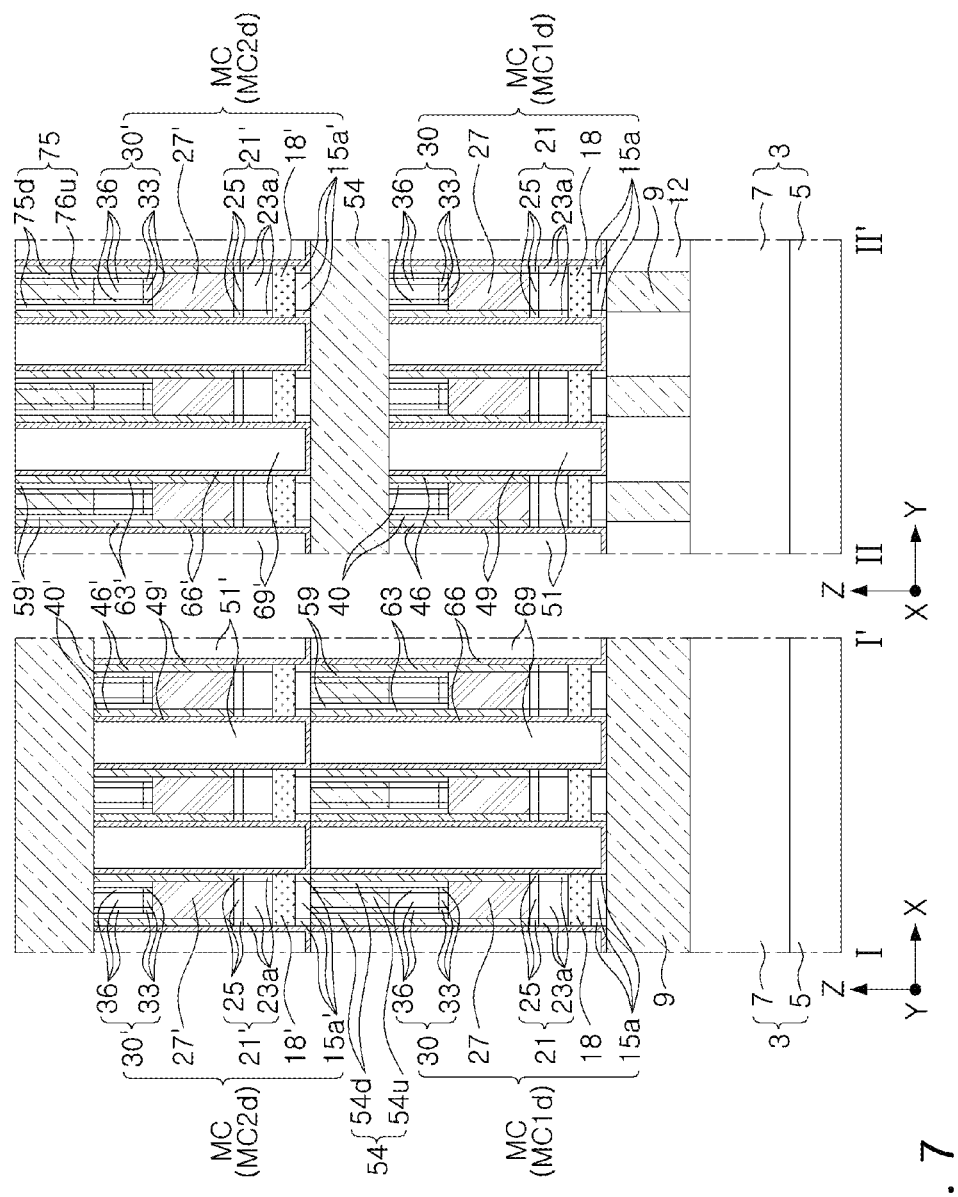
FIG. 7 is a cross-sectional view illustrating a modified example of a semiconductor device according to an example embodiment.

Next, a modified example of the semiconductor device according to an example embodiment will be described with reference to FIGS. 6 and 7. FIGS. 6 and 7 are cross-sectional views illustrating regions taken along lines I-I' and II-II' of FIG. 1.

Referring to FIG. 6, in the first memory cell structures (MC1a in FIG. 2 and MC1b in FIG. 4) and the second memory cell structures (MC2a in FIG. 2 and MC2b in FIG. 4) described above with reference to FIGS. 2 to 5, the second intermediate conductive layer 25 of FIGS. 2 to 5 may be replaced with a second intermediate conductive layer 25a which is not doped with the impurity element (e.g., nitrogen). Accordingly, the first upper conductive layer 33 may include the first region doped with the impurity element as the first region 33d' of FIGS. 3A and 3B, and the second intermediate conductive layer 25a may not be doped with the impurity element. The first memory cell structures MC1c and the second memory cell structures MC2c including the second intermediate conductive layer 25a as described above may be provided.

Lower inner spacers (40 and 59) may include a first lower inner spacer 40 below the second conductive lines 54, and a second lower inner spacer 59 extending onto side surfaces of the second conductive lines 54A. The first lower inner spacer 40 may be disposed between the first upper electrode pattern 30 of the first memory cell structures MC1c and the first lower spacer 46. The second lower inner spacer 59 may be disposed between the first upper electrode pattern 30 of the first memory cell structures MC1c and the second lower spacer 63.

Upper inner spacers (40' and 59') may include a first upper inner spacer 40' below the third conductive lines 75, and a second upper inner spacer 59' extending onto side surfaces of the second conductive lines 54. The first upper inner spacer 40' may be disposed between the second upper electrode patterns 30' of the second memory cell structures MC2c and the first upper spacer 46'. The second upper inner spacer 59' may be disposed between the second upper electrode patterns 30' of the second memory cell structures MC2c and the second upper spacer 63'.

Referring to FIG. 7, first and second memory cell structures MC1d and MC2d that may be formed of the same or substantially similar material layers as the first and second memory cell structures of MC1b and MC2b of FIG. 4, respectively, may be disposed. The first and second memory cell structures MC1d and MC2d may have the same or substantially similar cross-sectional structures as those of the first and second memory cell structures MC1c and MC2c of FIG. 6. The lower inner spacers 40 and 59 and the upper inner spacers 40' and 59' that are same as or substantially similar to those described with reference to FIG. 6 may be disposed.

Next, a modification of the semiconductor device according to an example embodiment will be described with reference to FIGS. 8 to 11, respectively. FIGS. 8 through 11 are cross-sectional views illustrating areas taken along lines I-I' and II-IF of FIG. 1.

Figure 8:
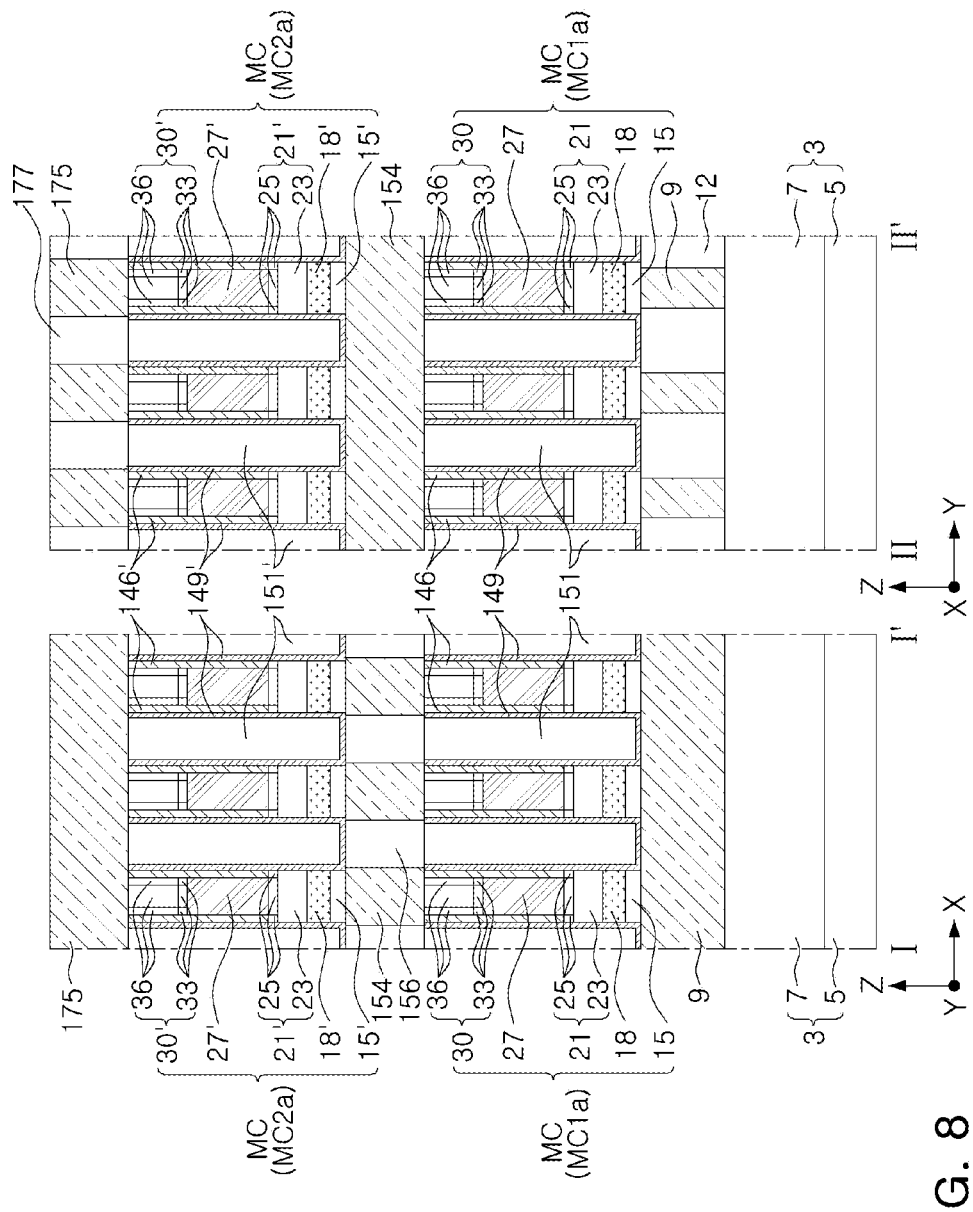
FIG. 8 is a cross-sectional view illustrating a modified example of a semiconductor device according to an example embodiment.

Referring to FIG. 8, on the first conductive lines 9 same as or substantially similar to those described with reference to FIGS. 2 to 3B, second conductive lines 154 extending in the second horizontal direction Y, and second gap-fill patterns 156 between the second conductive lines 154 may be disposed. On the second conductive lines 154, third conductive lines 175 extending in the first horizontal direction X, and third gap-fill patterns 177 between the third conductive lines 175 may be disposed. The second and third gap-fill patterns 156 and 177 may be formed of an insulating material such as silicon oxide or a low dielectric material.

Between the first and second conductive lines 9 and 154, first memory cell structures MC1a same as or substantially similar to those described above with reference to FIG. 2 may be disposed, and between the second and third conductive lines 154 and 175, second memory cell structures MC2a same as or substantially similar to those described above with reference to FIG. 2 may be disposed.

Below the second conductive lines 154 and the second gap-fill patterns 156, a lower interlayer insulating layer 151 may fill spaces between the first memory cell structures MC1a. Below the third conductive lines 175 and the third gap-fill patterns 177, an upper interlayer insulating layer 151' may fill spaces between the second memory cell structures MC2a.

A lower capping layer 149 may be disposed between the lower interlayer insulating layer 151 and the first memory cell structures MC1a, and may cover a lower surface of the lower interlayer insulating layer 151. An upper capping layer 149' may be disposed between the upper interlayer insulating layer 151' and the second memory cell structures MC2a, and may cover a lower surface of the upper interlayer insulating layer 151'.

A lower spacer 146 may surround side surfaces of the first data storage material pattern 27 and the first upper electrode pattern 30 of the first memory cell structures MC1a. An upper spacer 146' may surround side surfaces of the second data storage material pattern 27' and the second upper electrode pattern 30' of the second memory cell structures MC2a. The lower spacer 146 may be disposed between the first memory cell structures MC1a and the lower capping layer 149, and the upper spacer 146' may be disposed between the second memory cell structures MC2a and the upper capping layer 151'.

Figure 9:
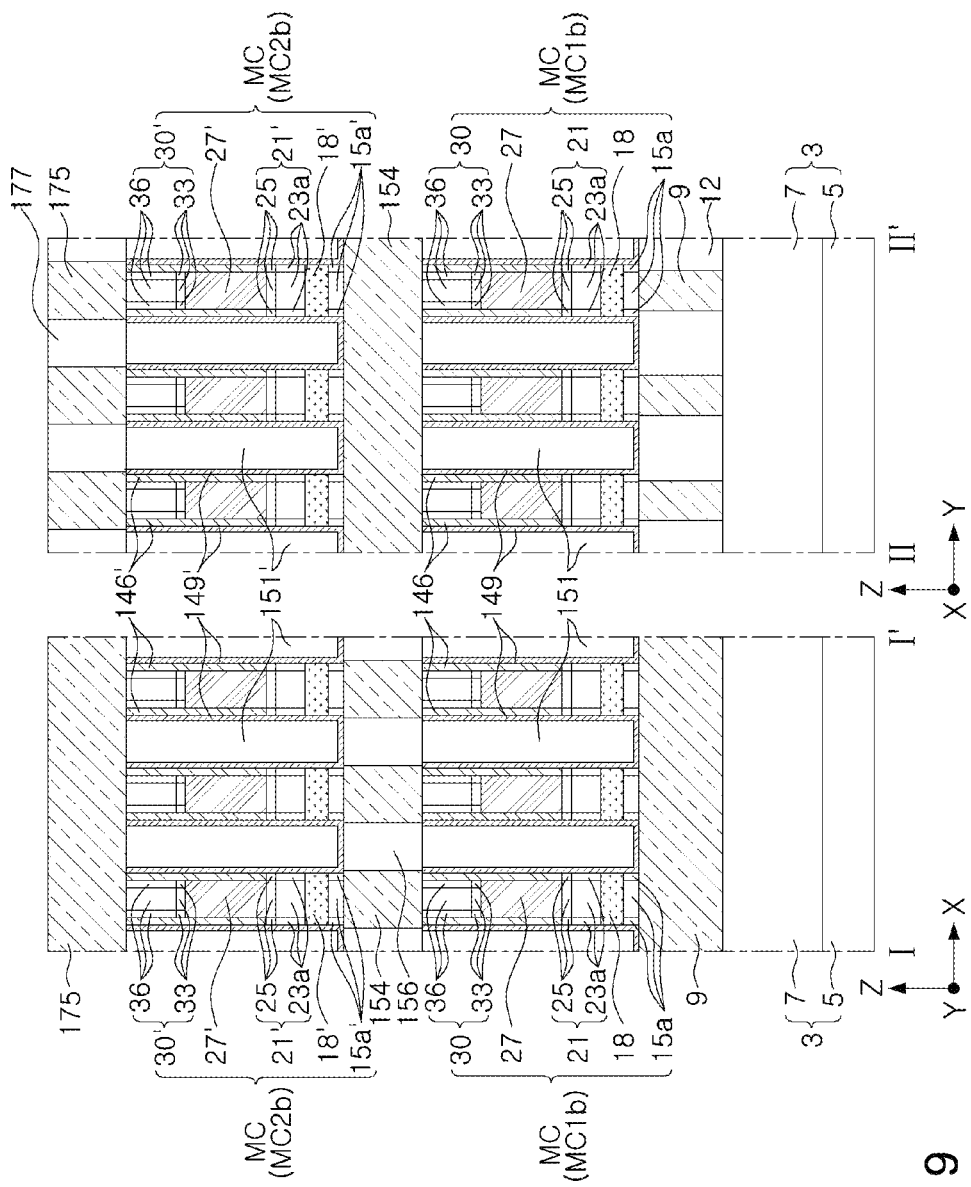
FIG. 9 is a cross-sectional view illustrating a modified example of a semiconductor device according to an example embodiment.

In a modified example, referring to FIG. 9, the first and second memory cell structures MC1a and MC1a described in FIG. 8 may be replaced by the first and second memory cell structures MC1b and MC2b described in FIGS. 4 and 5.

Figure 10:
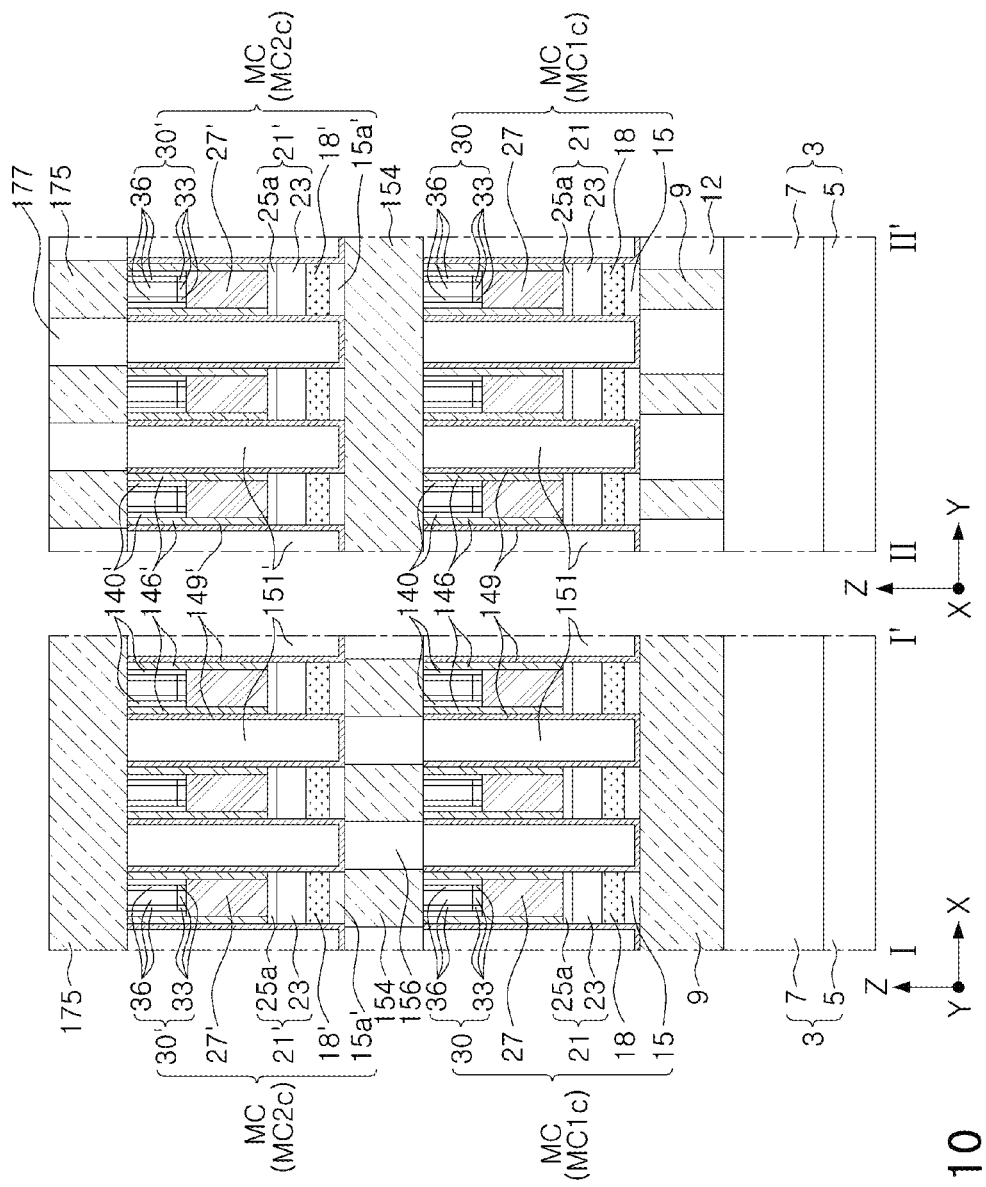
FIG. 10 is a cross-sectional view illustrating a modified example of a semiconductor device according to an example embodiment.

In a modified example, referring to FIG. 10, the first and second memory cell structures MC1a and MC1a described with reference to FIG. 8 may be replaced by the first and second memory cell structures MC1c and MC2c described with reference to FIG. 6.

A lower inner spacer 140 may be disposed between the first upper electrode pattern 30 of the first memory cell structures MC1c and the lower spacer 146. An upper inner spacer 140' may be disposed between the second upper electrode pattern 30' of the second memory cell structures MC2c and the upper spacer 146'.

Figure 11:
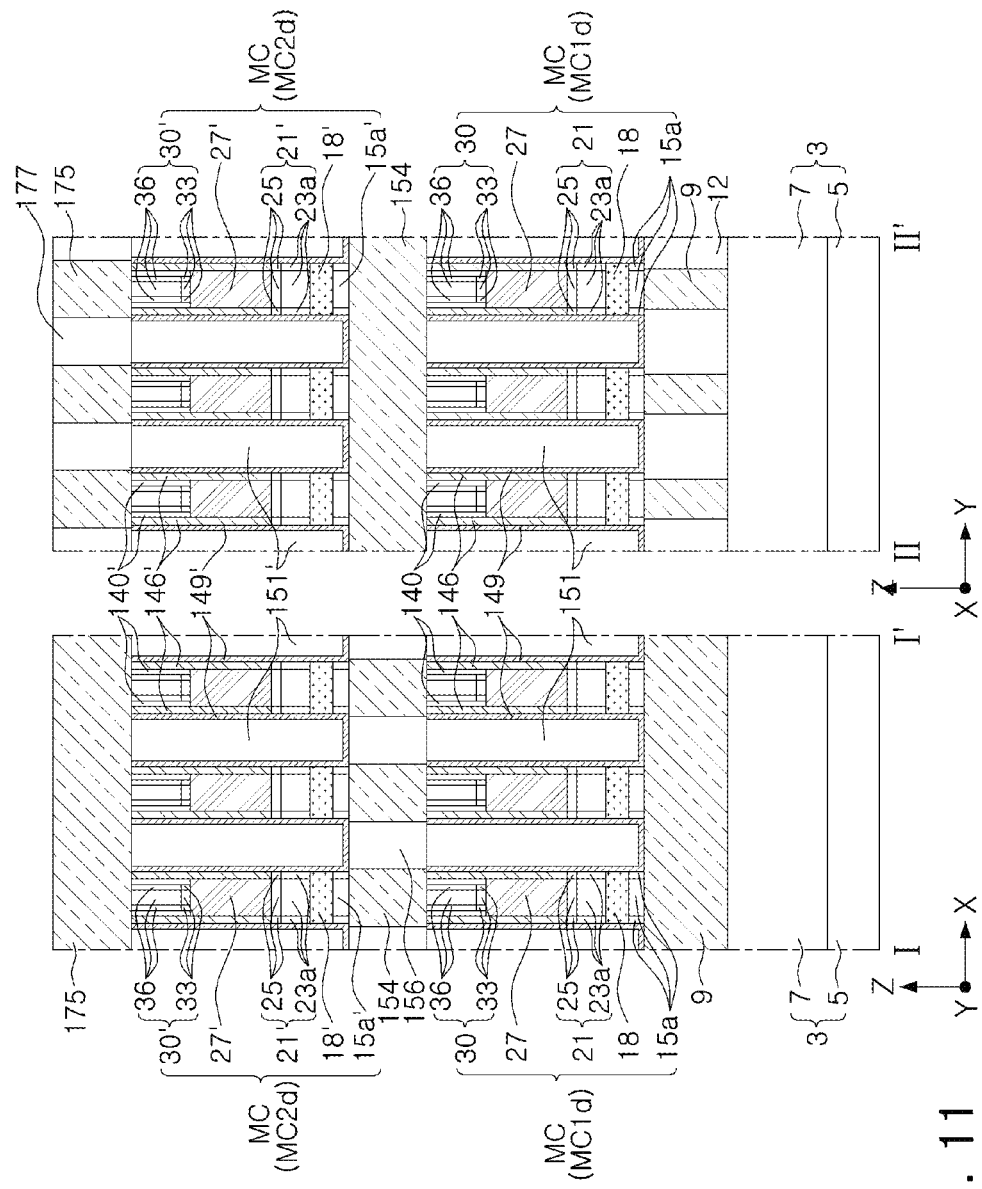
FIG. 11 is a cross-sectional view illustrating a modified example of a semiconductor device according to an example embodiment.

In a modified example, referring to FIG. 11, the first and second memory cell structures MC1c and MC1c described with reference to FIG. 10 may be replaced by the first and second memory cell structures MC1d and MC2d described with reference to FIG. 7.

Next, a method of forming a semiconductor device according to an example embodiment will be described with reference to FIGS. 12A through 12F. FIGS. 12A through 12F are cross-sectional views illustrating regions taken along lines I-I' and II-II' of FIG. 1, to describe an example of a method of forming the structure of the semiconductor device of FIG. 2.

Figure 12A:
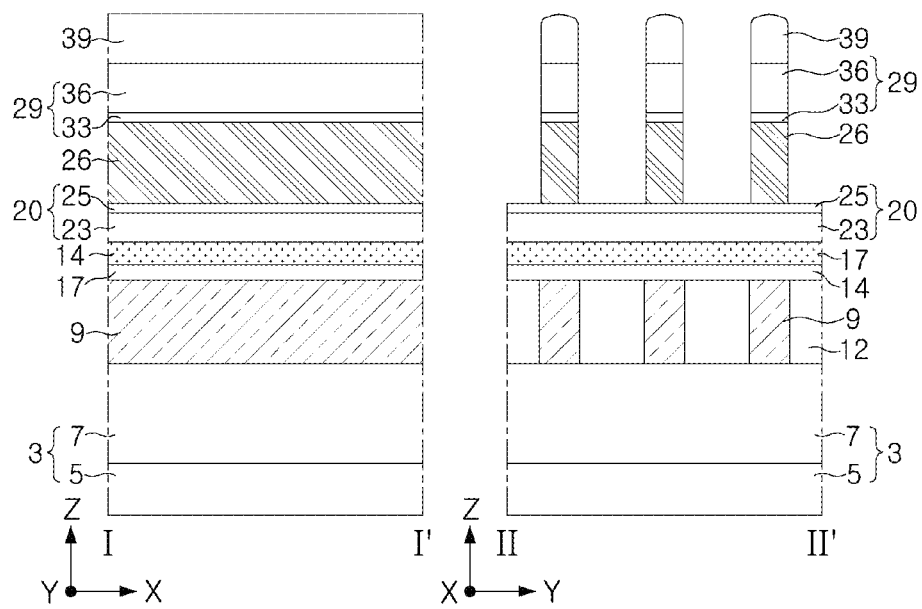
FIGS. 12A through 12F are cross-sectional views illustrating a method of forming a semiconductor device according to an example embodiment.

Referring to FIGS. 1 and 12A, first conductive lines 9 may be formed on a lower structure 3. The lower structure 3 may include a substrate 5 and a lower region 7 on the substrate 5. The substrate 5 may be a semiconductor substrate. The lower region 7 may be a circuit region in which circuit elements are formed.

Gap-fill patterns 12 may be formed between the first conductive lines 9.

A first lower electrode layer 14, a first switching material layer 17, a first intermediate electrode layer 20, a first data storage material layer 26, a first upper electrode layer 29, and a first mask 39 may be sequentially stacked on the first conductive lines 9 and the gap-fill patterns 12.

In an example, the first intermediate electrode layer 20 may include a first intermediate conductive layer 23 and a second intermediate conductive layer 25 that are sequentially stacked.

In an example, the first upper electrode layer 29 may include a first upper conductive layer 33 and a second upper conductive layer 36 that are sequentially stacked.

The first lower electrode layer 14, the first intermediate conductive layer 23, and the second upper conductive layer 36 may be formed of a carbon material layer or a carbon-containing material layer.

The first mask 39, the first upper electrode layer 29, and the first data storage material layer 26 may be patterned to form a linear shape. The second intermediate conductive layer 25 of the first intermediate electrode layer 20 may be exposed by the first mask 39, the first upper electrode layer 29, and the first data storage material layer 26 patterned in a linear shape.

Figure 12B:
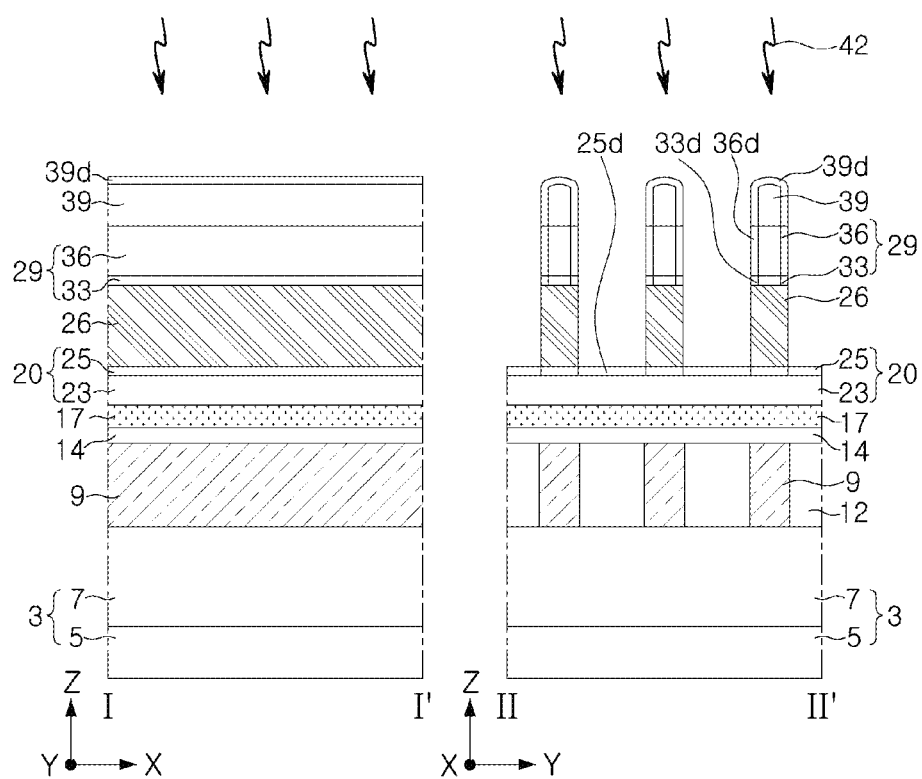

Referring to FIGS. 1 and 12B, a first surface treatment process 42 may be performed. In an example, the first surface treatment process 42 may be a plasma doping process. For example, the first surface treatment process 42 may be a plasma doping process performed using a gas in which a process gas (e.g., N or NH 3) and an inert gas (e.g., He or Ar).

Performing the first surface treatment process 42 may include doping an impurity element inside the first mask 39, the first upper electrode layer 29, and the first data storage material layer 26 patterned in a linear shape. The impurity element may be nitrogen (N).

By the first surface treatment process 42, a first region 39d doped with an impurity element (e.g., nitrogen) may be formed in the first mask 39, a first region 36d doped with the impurity element from a side of the second upper conductive layer 36 may be formed in the second upper conductive layer 36, a first region 33d doped with the impurity element from a side of the first upper conductive layer 33 may be formed in the first upper conductive layer 33, and a first region 25d doped with the impurity element from an exposed surface of the second intermediate conductive layer 25 may be formed in the second intermediate conductive layer 25.

In an example, at least one of the second upper conductive layer 36, the first upper conductive layer 33, and the intermediate conductive layer 25 may be partially doped with the impurity element. For example, in the second upper conductive layer 36, a portion of the second upper conductive layer 36 may be doped with the impurity element, and the middle of the second upper conductive layer 36 may not be doped with the impurity element.

In an example, an impurity element, for example, a nitrogen element, doped in the first data storage material layer 26 may be diffused toward an inside of the first data storage material layer 26 an. Accordingly, the first data storage material layer 26 may be formed of a material containing nitrogen.

Figure 12C:
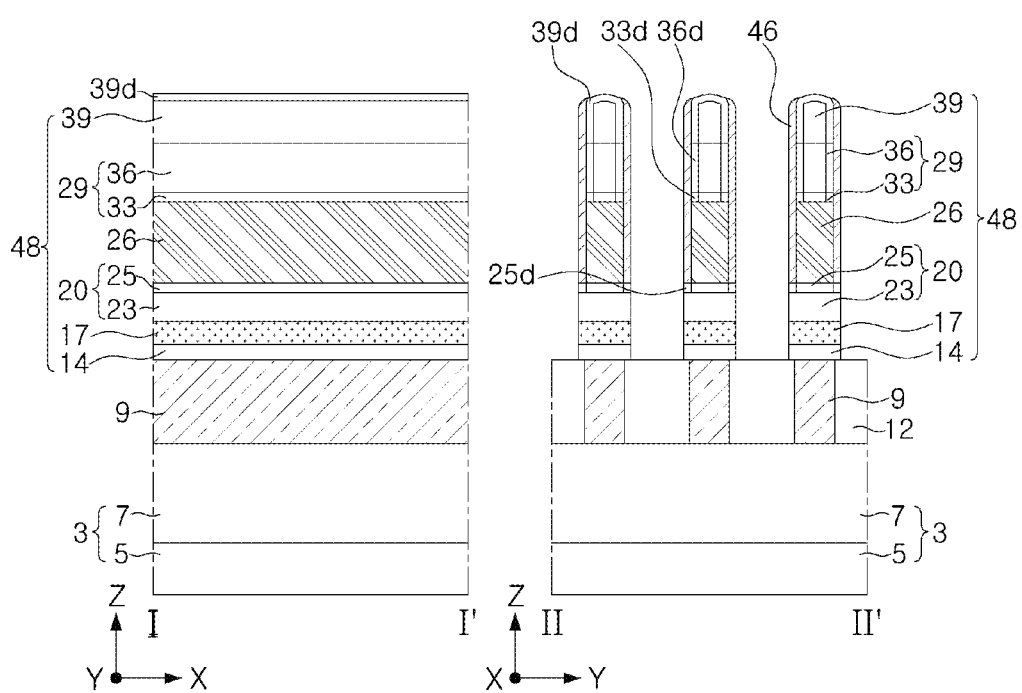

Referring to FIGS. 1 and 12C, after the first surface treatment process (42 in FIG. 12B), a first lower spacer 46 may be formed on side surfaces of the first mask 39, the first upper electrode layer 29, and the first data storage material layer 26 patterned in a linear shape.

In another example, the first surface treatment process (42 in FIG. 12B) may be performed after forming the first lower spacers 46.

By using an etching process using the first mask 39 and the first lower spacer 46 as an etch mask, the first intermediate electrode layer 20, the switching material layer 17, and the first lower electrode layer 14 may be patterned in a linear shape.

The first lower electrode layer 14, the switching material layer 17, the first intermediate electrode layer 20, the first data storage material layer 26, the first upper electrode layer 29, and the first mask 39, patterned in a linear shape may constitute line structures 48.

Figure 12D:
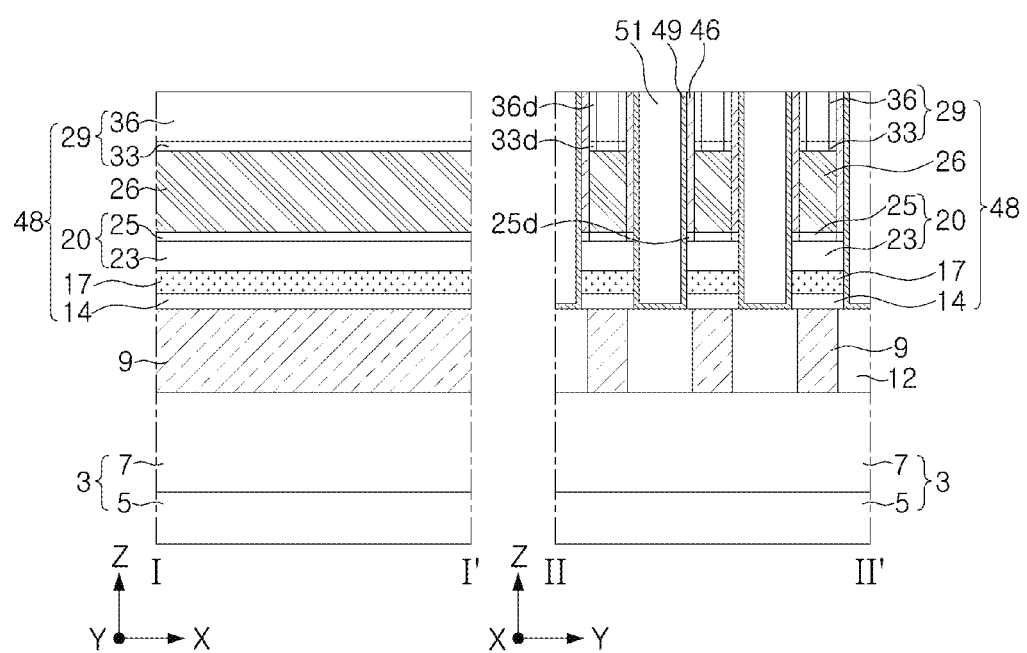

Referring to FIGS. 1 and 12D, a first lower capping layer 49 may be conformally formed on a substrate having the first lower spacer 46 and the line structures 48, a first insulating material layer may be formed on the first lower capping layer 49 to fill between the line structures 48, and a first lower interlayer insulating layer 51 may be formed by planarizing the first insulating material layer until an upper surface of the first upper electrode layer 29 is exposed by removing the first mask 39.

To form the first lower interlayer insulating layer 51, the first insulating material layer may be deposited and planarized using a chemical mechanical polishing process.

According to some example embodiments, by forming the first region 36d doped with the impurity element (e.g., nitrogen) on the first upper conductive layer 36 formed of a carbon material layer or a carbon-containing material layer, interface adhesion between the side surface of the first upper conductive layer 36 and the first lower spacer 46 may be improved. Thus, during planarization of the first insulating material layer to form the first lower interlayer insulating layer 51, the occurrence of defects due to a separation phenomenon between the side of the first upper conductive layer 36 and the first lower spacer 46 may be mitigated or prevented.

Figure 12E:
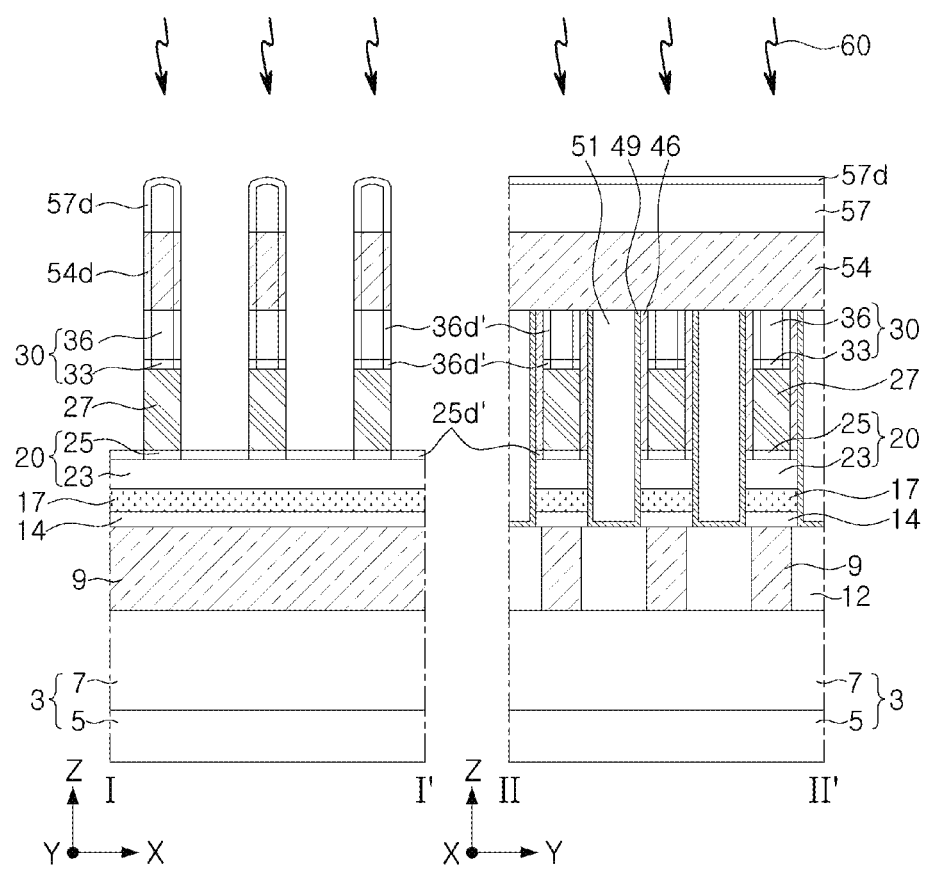

Referring to FIGS. 1 and 12E, a conductive material layer and a second mask 57 are formed on the line structures 48 of FIG. 12D and the first lower interlayer insulating layer 51, and the second intermediate conductive layer 25 of the first intermediate electrode layer 21 may be exposed by sequentially etching the conductive material layer, the first upper electrode layer (29 of FIG. 12D), and the first data storage material layer (26 of FIG. 12D) by using the second mask 57 as an etch mask. The conductive material layer may be etched to form second conductive lines 54, the first upper electrode layer 29 (see FIG. 12D) may be etched to form upper electrode patterns 30, and the first data storage material layer 26 of FIG. 12D may be etched to form data storage material patterns 27.

A second surface treatment process 60 may be performed. The second surface treatment process 60 may be same as or substantially similar to the first surface treatment process 42 described above with reference to FIG. 12B. The second surface treatment process 60 may be performed by doping the same impurity element as that in the first surface treatment process (42 in FIG. 12B), for example, nitrogen, in the exposed second intermediate conductive layer 25, and data storage material patterns 27, the first upper electrode patterns 30, and the second conductive lines 54 and the second mask 57 sequentially stacked.

By the second surface treatment process 60, the first region 57d in the second mask 57, and the first region 54d doped with the impurity element (e.g., nitrogen) from the side surfaces of the second conductive lines 54, may be formed.

The second upper conductive layer 36 of the first upper electrode patterns 30 may include a first region 36d' formed by the first surface treatment process (42 in FIG. 12B) and the second surface treatment process 60. The first upper conductive layer 33 of the first upper electrode patterns 30 may include a first region 33d' formed by the first surface treatment process (42 in FIG. 12B) and the second surface treatment process 60.

The impurity element (e.g., nitrogen) doped in the first data storage material patterns 27 by the first surface treatment process (42 in FIG. 12B) and the second surface treatment process 60 may be diffused into the first data storage material patterns 27. Thus, the first data storage material patterns 27 may include the impurity element.

The second intermediate conductive layer 25 may include a first region 25d' formed by the first surface treatment process (42 in FIG. 12B) and the second surface treatment process 60.

Figure 12F:
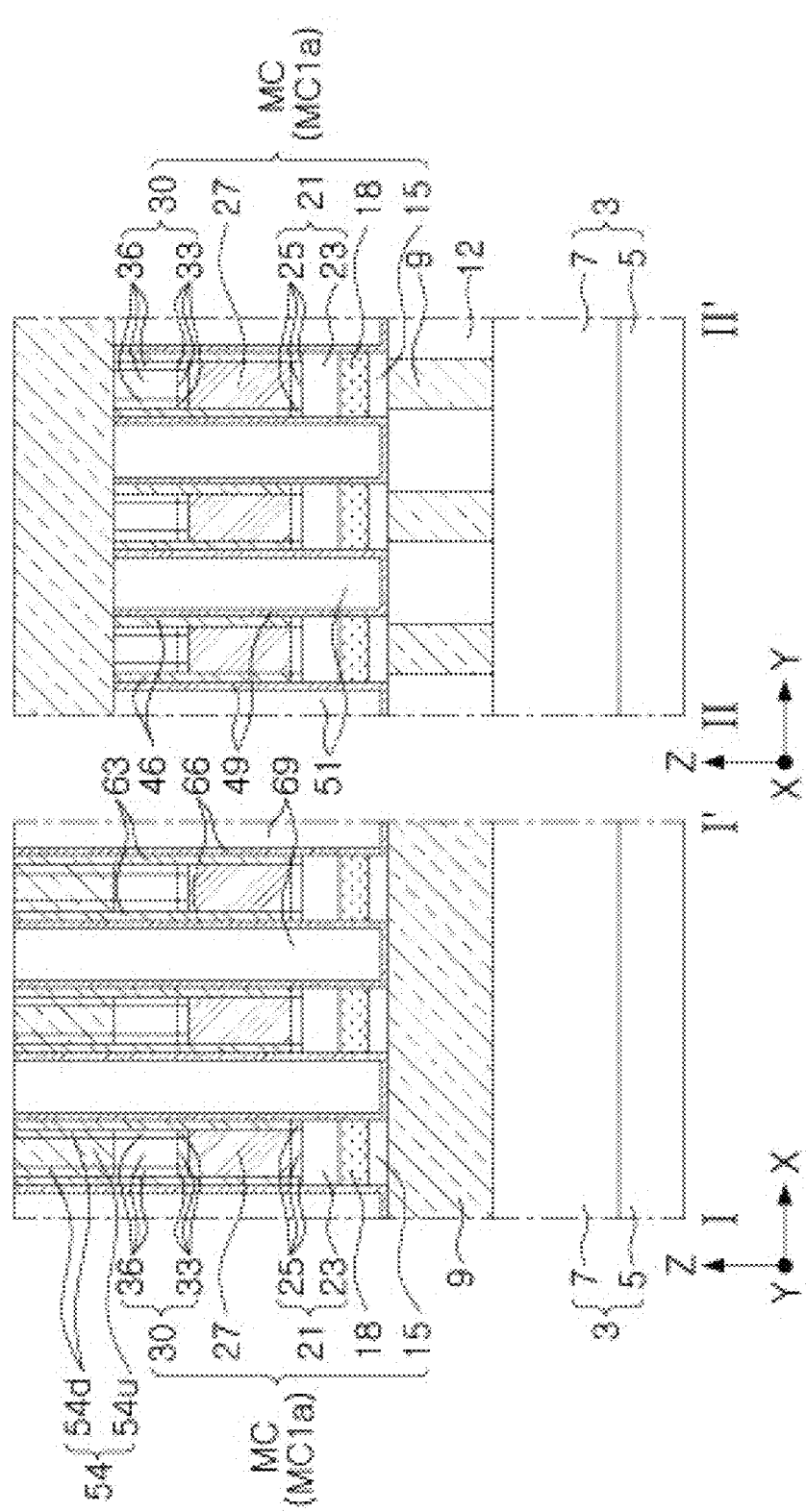

Referring to FIGS. 1 and 12F, a second lower spacer 63 may be formed on side surfaces of the first data storage material patterns 27, the first upper electrode patterns 30, the second conductive lines 54 and the second mask (57 in FIG. 12E).

In another example, the second surface treatment process (60 in FIG. 12E) may be performed after forming the second lower spacer 63.

The first intermediate electrode layer (20 in FIG. 12E), the switching material layer (17 in FIG. 12E), and the first lower electrode layer (14 in FIG. 12E) may be patterned by using the second mask (57 in FIG. 12E) and the second lower spacer 63 as an etch mask. The patterned first intermediate electrode layer 20 of FIG. 12E may form intermediate electrode patterns 21, the patterned switching material layer 17 of FIG. 12E may form switching material patterns 18, and the patterned first lower electrode layer 14 of FIG. 12E may form lower electrode patterns 15. Thus, first memory cell structures MC1a may be formed to include the first lower electrode patterns 15, the switching material patterns 18, the first intermediate electrode patterns 21, the first data storage material patterns 27, and the first upper electrode patterns 30.

A second lower capping layer 66 may be conformally formed on the substrate in which the first memory cell structures MC1a are formed. An insulating material layer may be formed on the second lower capping layer 66, and the insulating material layer may be planarized to expose the upper surfaces of the second conductive lines 54 while the second mask 57 (FIG. 12E) is removed, thereby forming a second lower interlayer insulating layer 69.

According to example embodiments, the first region 36d' is formed on the second upper conductive layer 36 formed of a carbon material layer or a carbon-containing material layer, thereby improving interfacial adhesion between a side surface of the first upper conductive layer 36 and the first and second lower spacers 46 and 63. Thus, during planarization of the insulating material layer to form the second lower interlayer insulating layer 69, defects may be mitigated or prevented from occurring due to a peeling phenomenon between the side surface of the first upper conductive layer 36 and the first and second lower spacers 46 and 63.

Subsequently, the second memory cell structures MC2a and the third conductive lines 75 as described above with reference to FIG. 2 may be formed on the substrate in which the first memory cell structures MC1a and the second lower interlayer insulating layer 69 are formed. The second memory cell structures MC2a and the third conductive lines 75 may be formed by the method same as or substantially similar to the method of forming the first memory cell structures MC1a and the second conductive lines 54.

Next, a method of forming semiconductor devices of various modifications will be described. Hereinafter, in describing a method of forming semiconductor devices of various modifications, descriptions of contents or methods that may be understood from the above description or methods will be omitted.

Figure 13A:
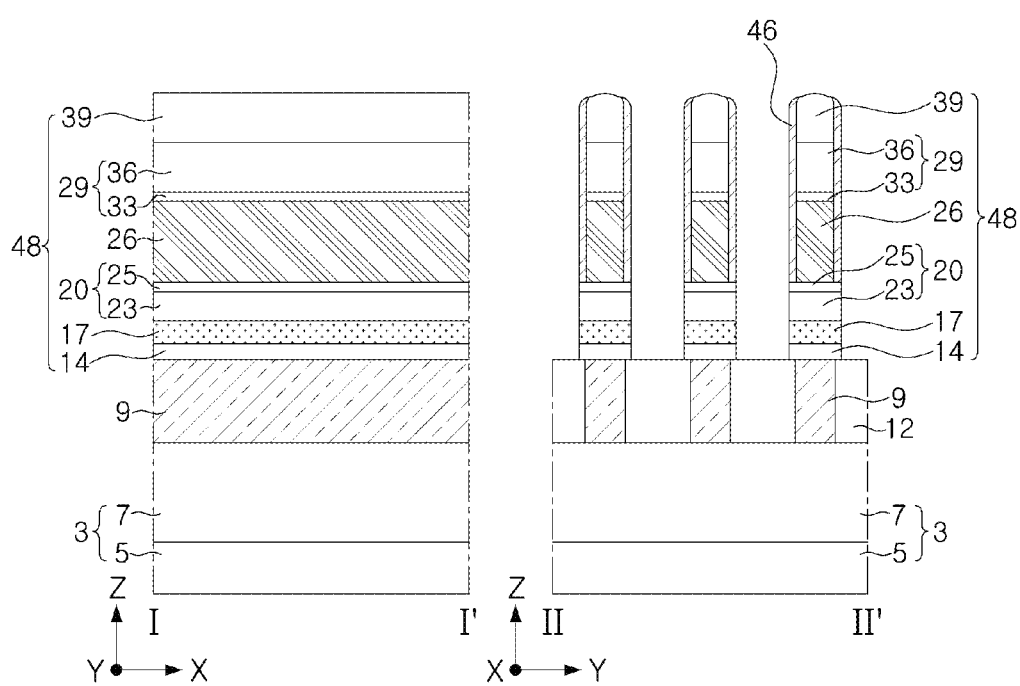
FIGS. 13A to 13C are cross-sectional views illustrating a modified example of a method of forming a semiconductor device according to an example embodiment.
Figure 13B:
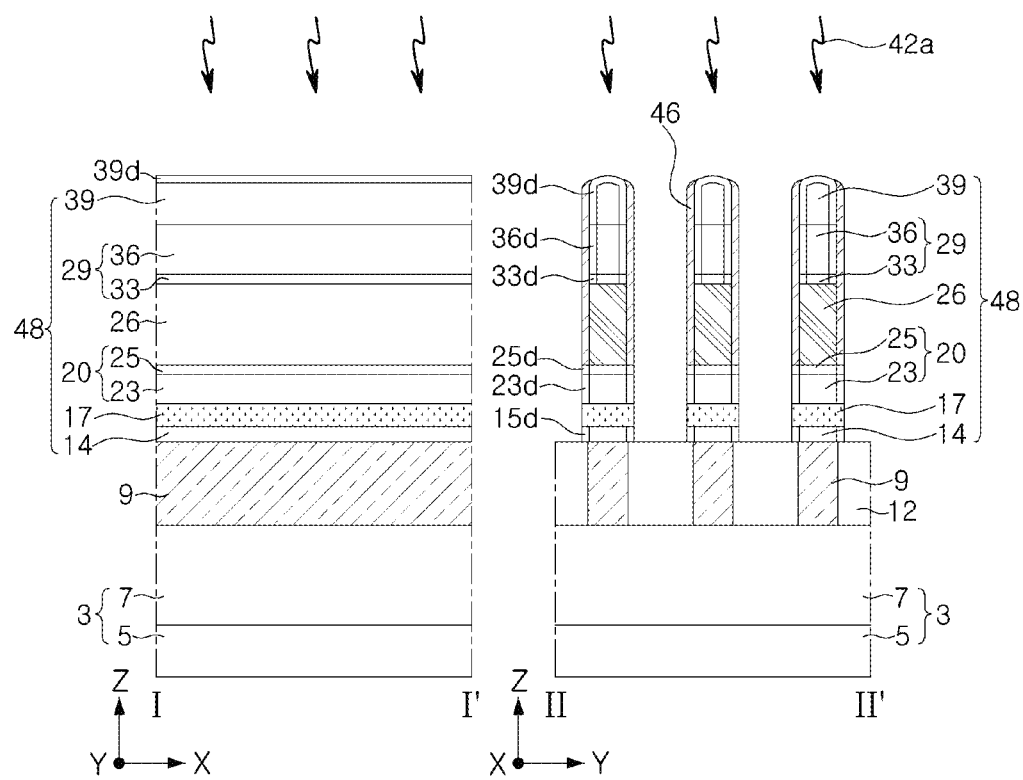
Figure 13C:
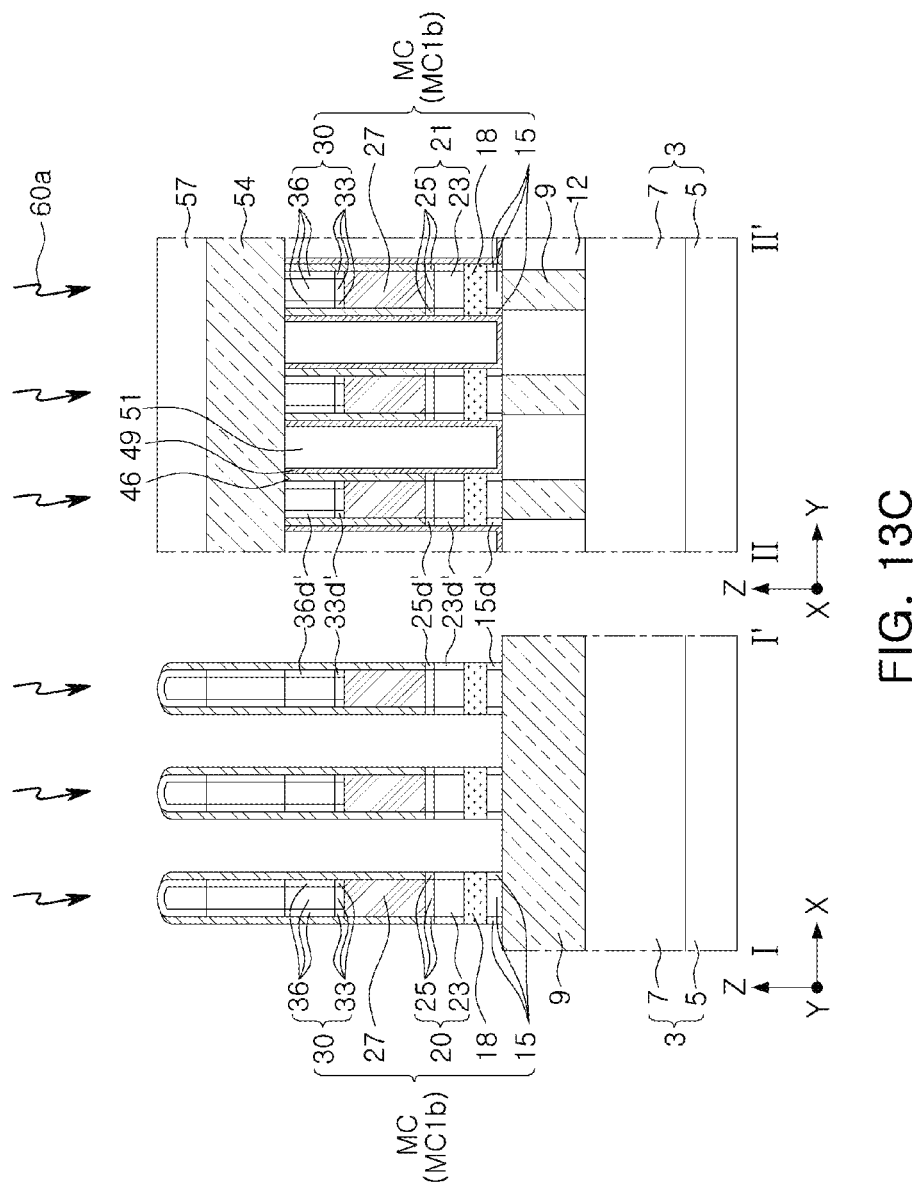

First, a method of forming a semiconductor device according to an example embodiment will be described with reference to FIGS. 13A through 13C. FIGS. 13A to 13C are cross-sectional views illustrating regions taken along lines I-I' and II-II' of FIG. 1 to describe an example of a method of forming the structure of the semiconductor device of FIG. 4.

Referring to FIGS. 1 and 13A, the lower structure 3, the first conductive lines 9, and the gap-fill patterns 12 may be formed as those described with reference to FIG. 12A. A first lower electrode layer 14, a first switching material layer 17, a first intermediate electrode layer 20, a first data storage material layer 26, a first upper electrode layer 29, and a first mask 39 may be sequentially stacked on the first conductive lines 9 and the gap-fill patterns 12. The first intermediate electrode layer 20 may include a first intermediate conductive layer 23 and a second intermediate conductive layer 25 sequentially stacked, and the first upper electrode layer 29 may include a first upper conductive layer 33 and a second upper conductive layer 36 sequentially stacked.

The first mask 39, the first upper electrode layer 29, and the first data storage material layer 26 are patterned to form a linear shape, a first lower spacer 46 is formed on side surfaces of the first mask 39, the first upper electrode layer 29 and the first data storage material layer 26 patterned to be a linear shape, and the first intermediate electrode layer 20, the switching material layer 17 and the first lower electrode layer 14 may be patterned in a linear shape by using the first mask 39 and the first lower spacer 46 as an etch mask. The first lower electrode layer 14, the switching material layer 17, the first intermediate electrode layer 20, the first data storage material layer 26, the first upper electrode layer 29, and the first mask 39 patterned in a linear shape may constitute line structures 48.

Referring to FIGS. 1 and 13B, a first surface treatment process 42a may be performed. In the line structures 48, a first region 39d doped with an impurity element (e.g., nitrogen) in the first mask 39 by the first surface treatment process 42a, a first region 36d in the second upper conductive layer 36, doped with the impurity element from a side of the second upper conductive layer 36, a first region 33d in the first upper conductive layer 33, doped with the impurity element from a side of the first upper conductive layer 33, a first region 25d in the second intermediate conductive layer 25, doped with the impurity element from a side of the second intermediate conductive layer 25, and a first region 23d in the first intermediate conductive layer 23, doped with the impurity element from a side surface of the first intermediate conductive layer 23, may be formed. The surface treatment process 42a may be a plasma doping process, for example, a plasma doping process for doping nitrogen.

Referring to FIGS. 1 and 13C, a first lower capping layer 49 is conformally formed on a substrate having the first lower spacer 46, and the line structures (see 48 of FIG. 13B). Further, a first insulating material layer is formed on the first lower capping layer 49 to fill between the line structures 48, and the first mask 39 (see FIG. 13B) is removed and the first insulating material layer is planarized until the upper surface of the first upper electrode layer 29 is exposed, thereby forming a first lower interlayer insulating layer 51.

A conductive material layer and a second mask 57 are formed on the line structures 48 of FIG. 13B and the first lower interlayer insulating layer 51, and the second mask 57 is used as an etch mask to sequentially etch the conductive material layer, the first upper electrode layer (29 in FIG. 13B), and the first data storage material layer (26 in FIG. 13B) to expose the second intermediate conductive layer (25 in FIG. 13B) of the first intermediate electrode layer 21. The conductive material layer may be etched to form second conductive lines 54, the first upper electrode layer 29 of FIG. 13B may be etched to form upper electrode patterns 30, and the first data storage material layer 26 of FIG. 13B may be etched to form data storage material patterns 27.

A second lower spacer 63 may be formed on side surfaces of the first data storage material patterns 27, the first upper electrode patterns 30, the second conductive lines 54 and the second mask 57, and the second mask 57 and the second lower spacer 63 are used as an etch mask to pattern the first intermediate electrode layer (20 in FIG. 13B), the switching material layer (17 in FIG. 13B) and the first lower electrode layer 14 of FIG. 13B. The patterned first intermediate electrode layer 20 of FIG. 13B may form intermediate electrode patterns 21, the patterned switching material layer 17 of FIG. 13B may form switching material patterns 18, and the patterned first lower electrode layer 14 of FIG. 13B may form lower electrode patterns 15.

A second surface treatment process 60a may be performed. The second surface treatment process 60a may be same as or substantially similar to the first surface treatment process 42A of FIG. 13B described above. By the second surface treatment process 60a, a first region 57d doped with the impurity element may be formed in the second mask 57, and first regions 54d doped with the impurity element from the side surfaces of the second conductive lines 54 may be formed in the second conductive lines 54.

By the first surface treatment process (42a) and the second surface treatment process (60a), a first region 36d' in the second upper conductive layer 36, doped with an impurity element (e.g., nitrogen) from the side of the second upper conductive layer 36, a first region 33d' in the first upper conductive layer 33, doped with the impurity element from the side surface of the first upper conductive layer 33, a first region 25d' in the second intermediate conductive layer 25, doped with the impurity element from the side surface of the second intermediate conductive layer 25 of the intermediate electrode patterns 21, a first region 23d' in the first intermediate conductive layer 23a, doped with the impurity element from the side surface of the first intermediate conductive layer 23a of the intermediate electrode patterns 21, and a first region 15d' in the first lower electrode patterns 15, doped with the impurity element from the side surface of the first lower electrode patterns 15, may be formed. By the first surface treatment process 42a and the second surface treatment process 60a, the data storage material pattern 27 and the switching material pattern 18 may include the impurity element (e.g., nitrogen). Thus, first memory cell structures MC1b, including the first lower electrode patterns 15a, the switching material patterns 18, the first intermediate electrode patterns 21, the first data storage material patterns 27 and the first upper electrode patterns 30, may be formed.

Referring to FIGS. 1 and 4, a second lower capping layer 66 may be conformally formed on a substrate in which the first memory cell structures MC1a are formed. An insulating material layer is formed on the second lower capping layer 66, and the insulating material is planarized to expose upper surfaces of the second conductive lines 54 while the second mask 57 (FIG. 13C) is removed, thereby forming a second lower interlayer insulating layer 69.

Subsequently, the second memory cell structures MC2b and the third conductive lines 75 as described above with reference to FIG. 4 may be formed on the substrate in which the first memory cell structures MC1b and the second lower interlayer insulating layer 69 are formed. The second memory cell structures MC2b and the third conductive lines 75 may be formed in the same or substantially similar manner as forming the first memory cell structures MC1b and the second conductive lines 54.

Next, a method of forming a semiconductor device according to an example embodiment will be described with reference to FIGS. 14A to 14D. FIGS. 14A to 14D are cross-sectional views illustrating regions taken along lines I-I' and II-II' of FIG. 1 to illustrate an example of a method of forming the structure of the semiconductor device of FIG. 6.

Figure 14A:
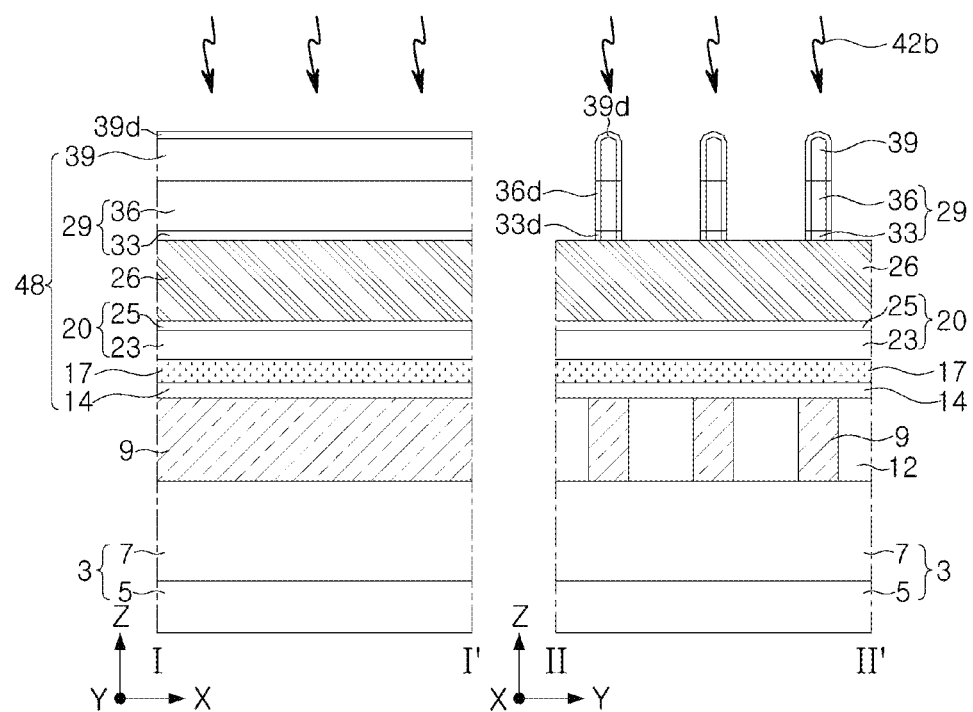
FIGS. 14A to 14D are cross-sectional views illustrating a modified example of a method of forming a semiconductor device according to an example embodiment.

Referring to FIGS. 1 and 14A, the lower structure 3, the first conductive lines 9, and the gap-fill patterns 12 may be formed as described with reference to FIG. 12A. A first lower electrode layer 14, a first switching material layer 17, a first intermediate electrode layer 20, a first data storage material layer 26, a first upper electrode layer 29 and a first mask 39 may be sequentially stacked on the first conductive lines 9 and the gap-fill patterns 12. The first intermediate electrode layer 20 may include a first intermediate conductive layer 23 and a second intermediate conductive layer 25 sequentially stacked, and the first upper electrode layer 29 may include a first upper conductive layer 33 and a second upper conductive layer 36 sequentially stacked.

The first mask 39 and the first upper electrode layer 29 may be patterned to form a linear shape. The first surface treatment process 42b, which is same as or substantially similar to that described with reference to FIG. 13B, may be performed to form a first region 39d doped with an impurity element (e.g., nitrogen) in the first mask 39, a first region 33d doped with the impurity element in the first upper conductive layer 33 of the first upper electrode layer 29, and a first region 36d doped with the impurity element in the second upper conductive layer 36 of the first upper electrode layer 29.

Figure 14B:
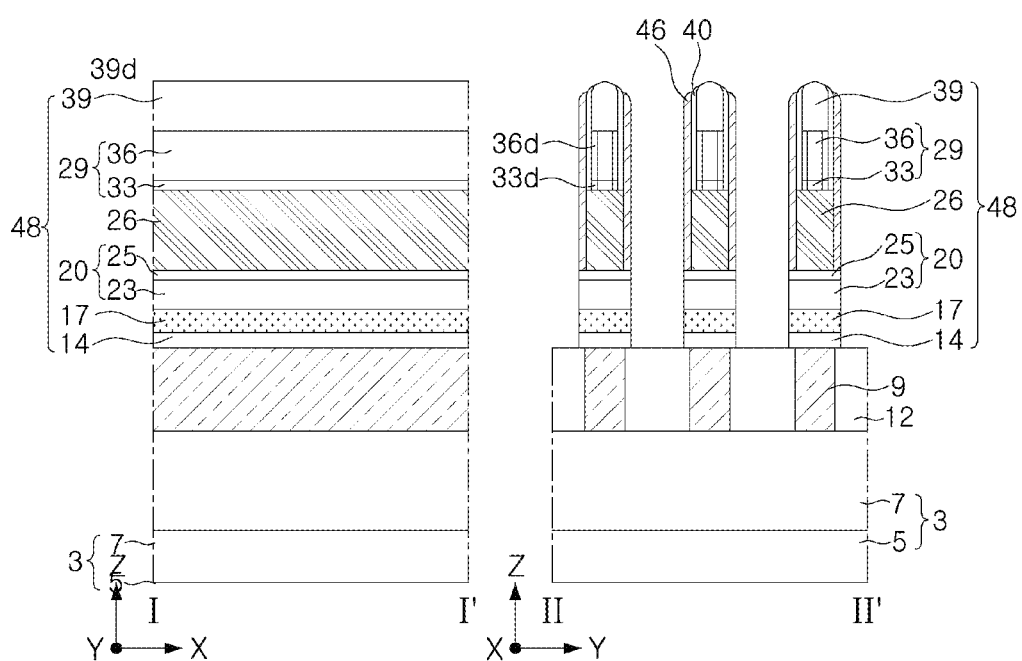

Referring to FIGS. 1 and 14B, a first inner spacer 40 may be formed on side surfaces of the first mask 39 and the first upper electrode layer 29 patterned in a linear shape.

In another example, the first surface treatment process 42b may be performed after the first inner spacer 40 is formed.

By using the first mask 39 and the first inner spacer 40 as an etch mask, the first data storage material layer 26 may be patterned in a linear shape. A first lower spacer 46 may cover a side surface of the patterned first data storage material layer 26 and an outer surface of the first inner spacer 40. Further, the first mask 39 and the first lower spacer 46 are used as an etch mask to pattern the first intermediate electrode layer 20, the switching material layer 17 and the first lower electrode layer 14 in a linear shape. The first lower electrode layer 14, the switching material layer 17, the first intermediate electrode layer 20, the first data storage material layer 26, the first upper electrode layer 29 and the first mask 39 patterned in a linear shape may constitute line structures 48.

Figure 14C:
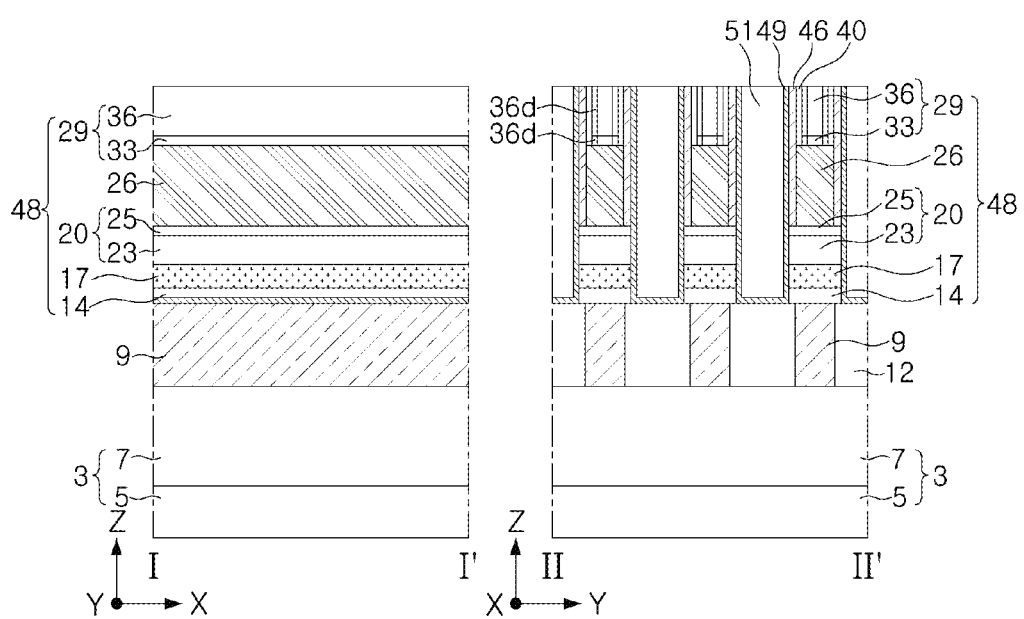

Referring to FIGS. 1 and 14C, a first lower capping layer 49 is conformally formed on a substrate having the first lower spacer 46, and the line structures (see 48 of FIG. 14B). Further, a first insulating material layer is formed on the first lower capping layer 49 to fill between the line structures 48, and the first mask (39 in FIG. 14B) is removed and the first insulating material layer is planarized until the upper surface of the first upper electrode layer 29 is exposed, thereby forming a first lower interlayer insulating layer 51.

Figure 14D:
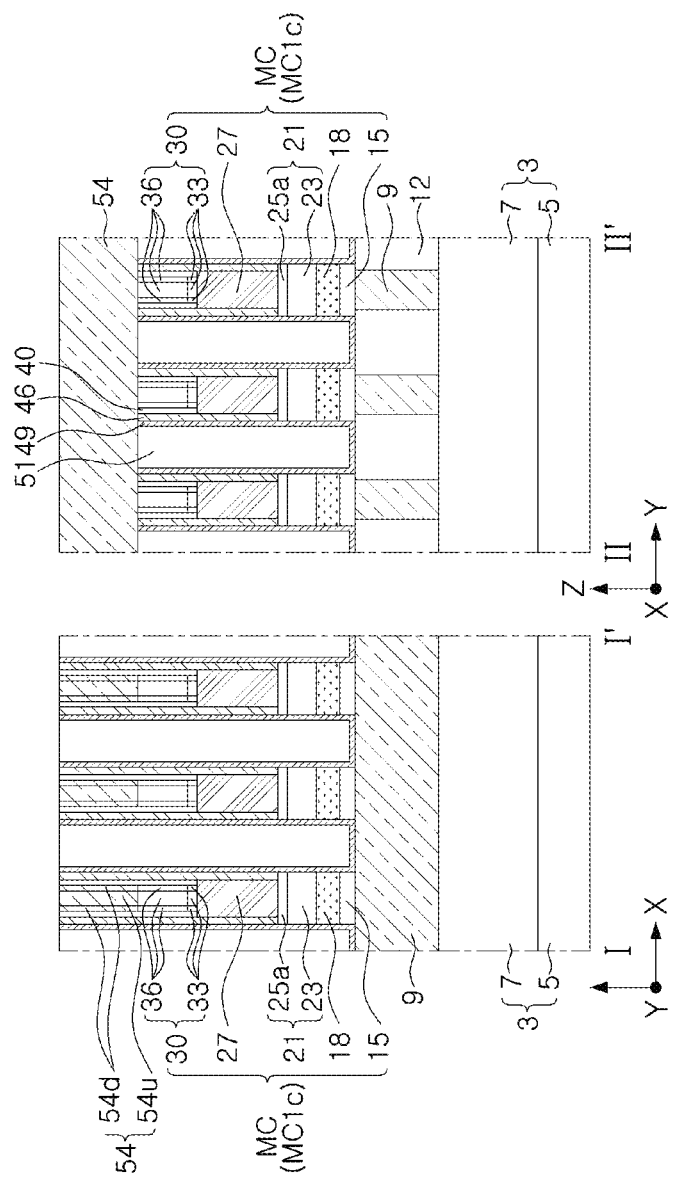

Referring to FIGS. 1 and 14D, a conductive material layer and a second mask 57 are formed on the line structures 48 of FIG. 13B and the first lower interlayer insulating layer 51, and the same method as or a substantially similar method to that performed in the II-II' cross-sectional area described with reference to FIG. 14C may be performed in the I-I' cross-sectional area. Therefore, the same first memory cell structures MC1c as that described with reference to FIG. 6 may be formed. The second memory cell structures MC2c of FIG. 6 may be formed by the same or substantially similar method as the method of forming the first memory cell structures MC1c.

Next, a method of forming a semiconductor device according to an example embodiment will be described with reference to FIGS. 15A to 15D. FIGS. 15A to 15D are cross-sectional views illustrating regions taken along lines I-I' and II-II' of FIG. 1 to illustrate an example of a method of forming the structure of the semiconductor device of FIG. 8.

Figure 15A:
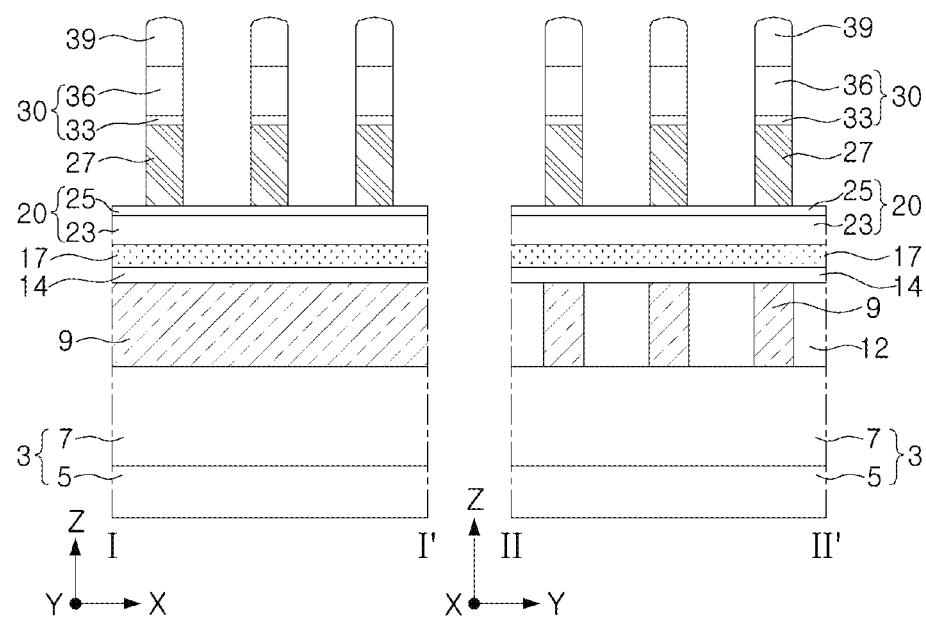
FIGS. 15A to 15D are cross-sectional views illustrating a modified example of a method of forming a semiconductor device according to an example embodiment.

Referring to FIGS. 1 and 15A, the lower structure 3, the first conductive lines 9, and the gap-fill patterns 12 may be formed as described with reference to FIG. 12A. A first lower electrode layer 14, a first switching material layer 17, a first intermediate electrode layer 20, a first data storage material layer, a first upper electrode layer and a mask 39 may be sequentially stacked on the first conductive lines 9 and the gap-fill patterns 12. The first intermediate electrode layer 20 may include a first intermediate conductive layer 23 and a second intermediate conductive layer 25 that are sequentially stacked, and the first upper electrode layer may include a first upper conductive layer 33 and a second upper conductive layer 36 sequentially stacked.

The first upper electrode layer and the first data storage material layer are etched by an etching process using the mask 39 as an etch mask, and thus, the first upper electrode patterns 30 and the first data storage material patterns 27 may be formed. The first upper electrode patterns 30 may be polygonal or circular, such as a quadrangle and the like, when viewed in a plan view. The first data storage patterns 27 may be aligned with the first upper electrode patterns 30.

Figure 15B:
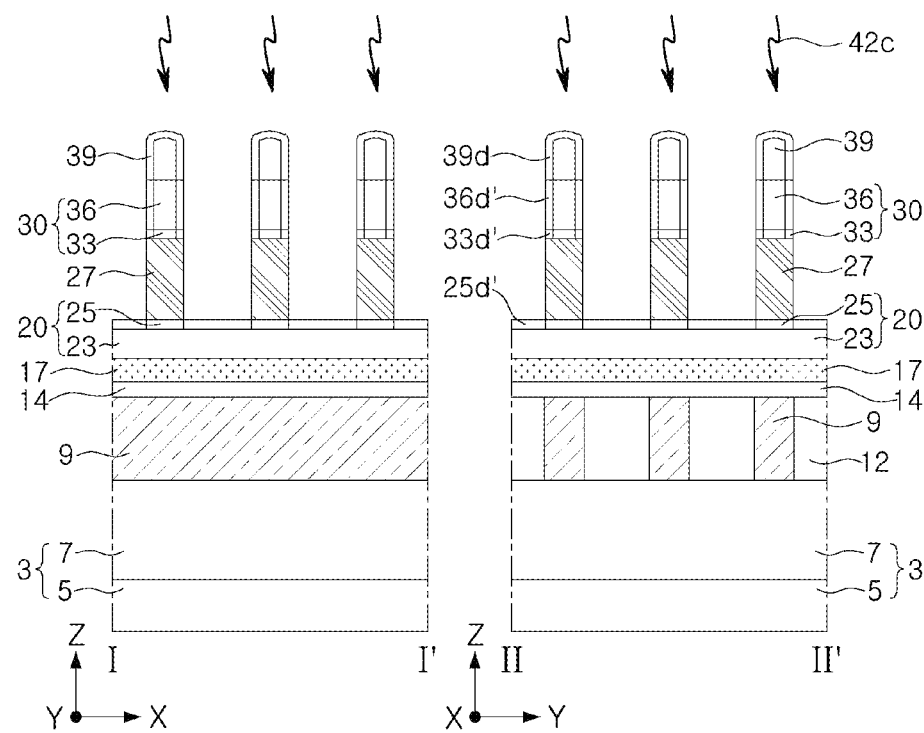

Referring to FIGS. 1 and 15B, a surface treatment process 42c same as or substantially similar to the first surface treatment process 42 described with reference to FIG. 12B may be performed. By the first surface treatment process 42c, a first region 39d doped with an impurity element (e.g., nitrogen) in the mask 39, a first region 36d' in the second upper conductive layer 36, doped with the impurity element from the side of the second upper conductive layer 36, a first region 33d' in the first upper conductive layer 33, doped with the impurity element from the side surface of the first upper conductive layer 33, and a first region 25d' in the second intermediate conductive layer 25, doped with the impurity element from an exposed surface of the second intermediate conductive layer 25, may be formed.

Figure 15C:
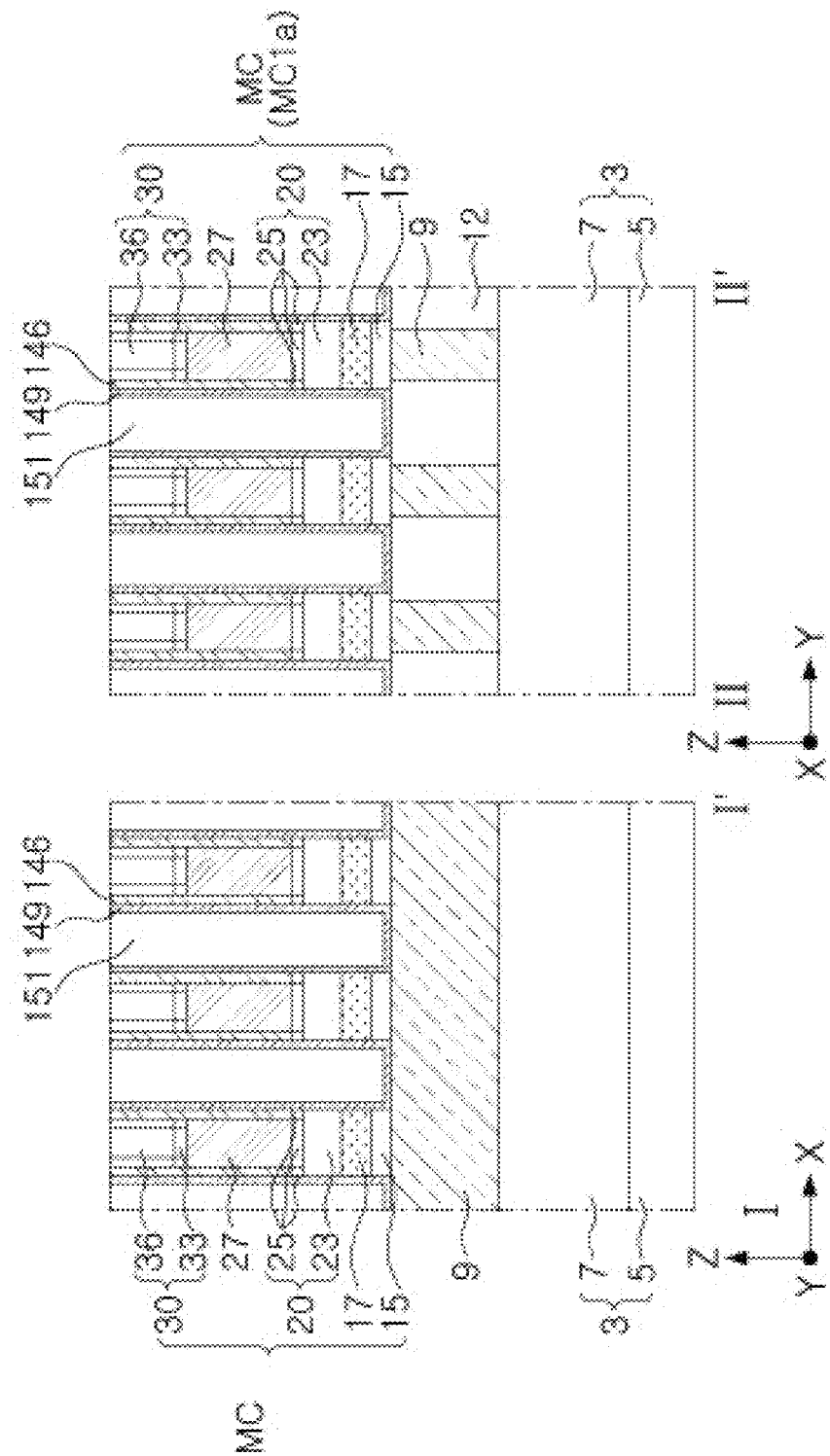

Referring to FIGS. 1 and 15C, a lower spacer 146 may be formed on side surfaces of the data storage material patterns 27, the first upper electrode patterns 30, and the mask (see 39 of FIG. 15B).

In another example, the surface treatment process (42c in FIG. 15B) may be performed after forming the lower spacer 146.

By using the mask 39 of FIG. 15B and the lower spacer 146 as an etch mask, the first intermediate electrode layer 20 of FIG. 15B, the first switching material layer 17 of FIG. 15B, and the first lower electrode layer 14 of FIG. 15B may be etched to form first intermediate electrode patterns 21, first switching material patterns 18, and first lower electrode patterns 15. Accordingly, the same first memory cell structures MC1a as those described with reference to FIG. 8 may be formed.

Subsequently, a lower capping layer 149 is conformally formed on a substrate having the lower spacer 146 and the first memory cell structures MC1a, and an insulating material layer may be formed on the lower capping layer 149, to fill between the first memory cell structures MC1a, and the mask (39 in FIG. 15B) is removed and the insulating material layer is planarized until the upper surfaces of the first upper electrode patterns 30 are exposed, thereby forming a lower interlayer insulating layer 151.

Figure 15D:
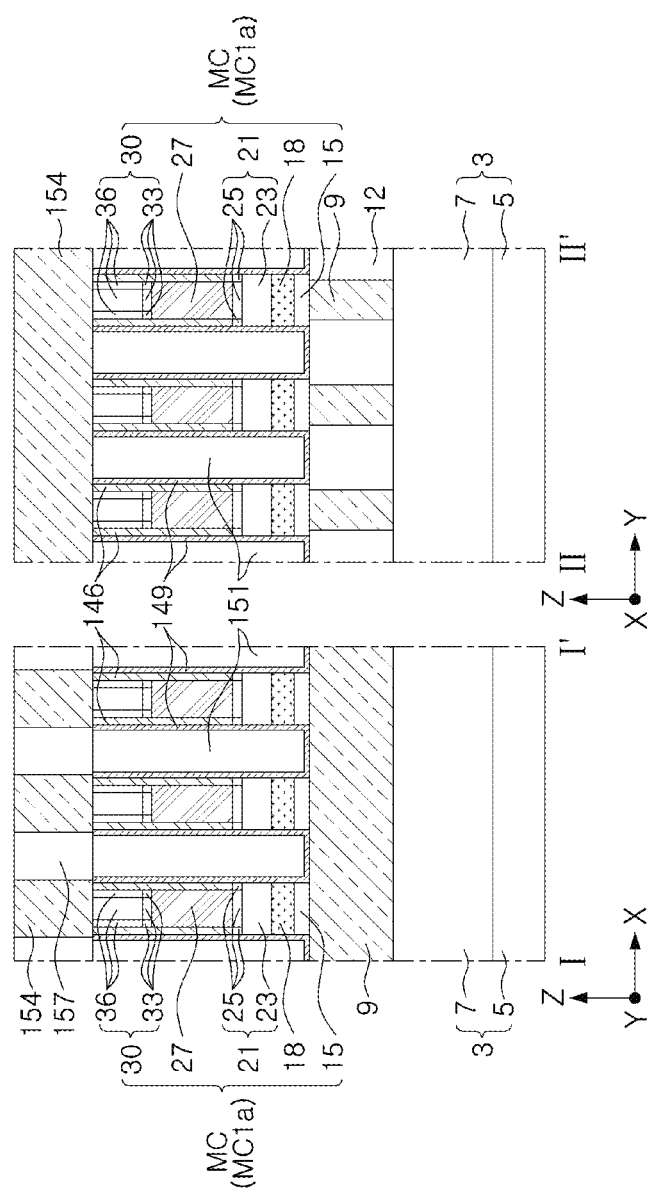

Referring to FIGS. 1 and 15D, second conductive lines 154 may be formed on the first memory cell structures MC1a and the lower interlayer insulating layer 151. Second gap-fill patterns 157 may be formed on the second conductive lines 154.

Referring back to FIGS. 1 and 8, the second memory cell structures MC1b described in FIG. 8 may be formed on the second conductive lines 154 and the second gap-fill patterns 157 by the same method as the method described with reference to FIGS. 15A through 15C.

Figure 16A:
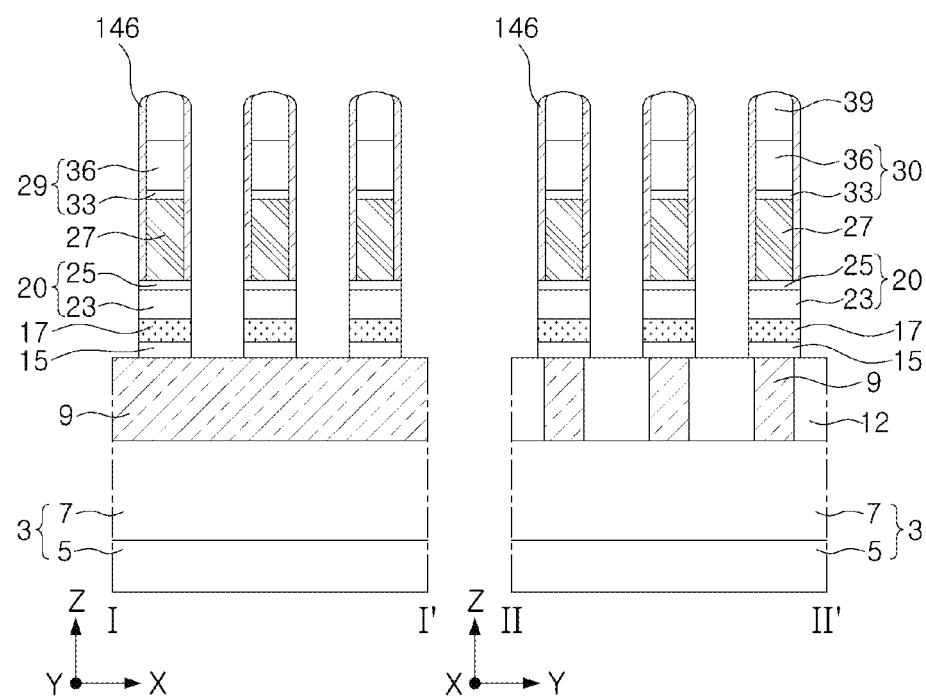
FIGS. 16A and 16B are cross-sectional views illustrating a modified example of a method of forming a semiconductor device according to an example embodiment.
Figure 16B:
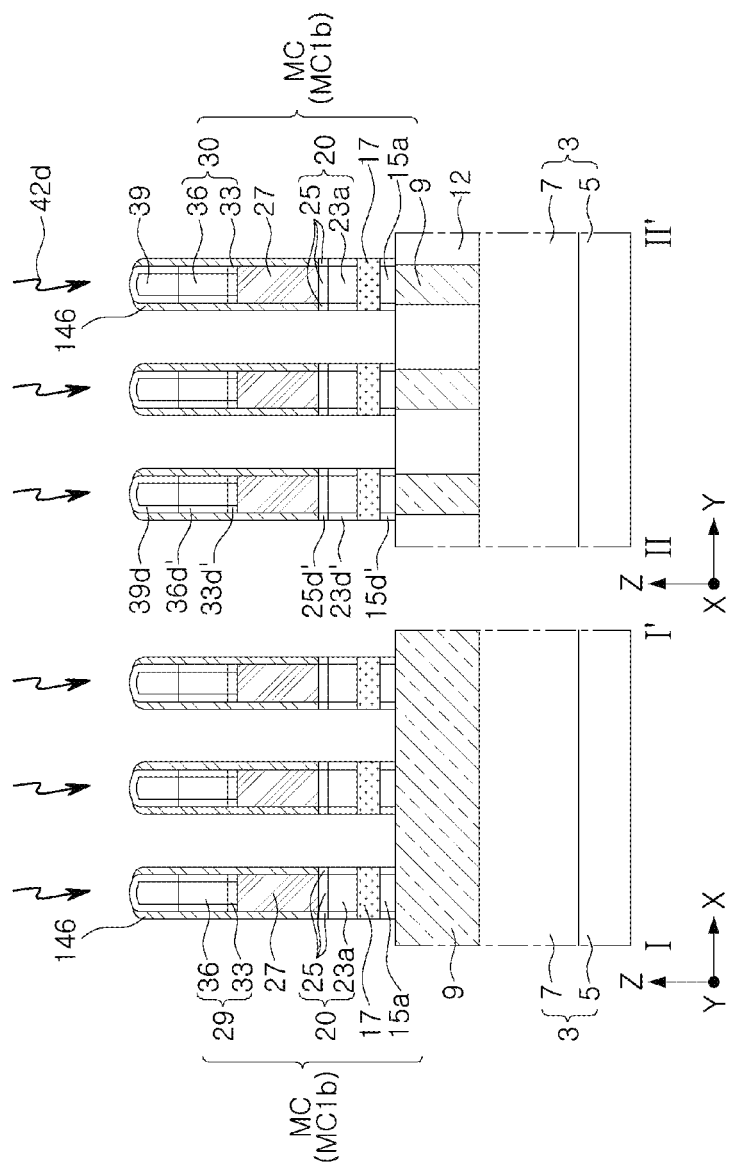

Next, a method of forming a semiconductor device according to an example embodiment will be described with reference to FIGS. 16A and 16B. FIGS. 16A and 16B are cross-sectional views illustrating regions taken along lines I-I' and II-II' of FIG. 1 to illustrate an example of a method of forming the structure of the semiconductor device of FIG. 9.

Referring to FIGS. 1 and 16A, the lower structure 3, the first conductive lines 9, and the gap-fill patterns 12 may be formed as described with reference to FIG. 12A. A first lower electrode layer, a first switching material layer, a first intermediate electrode layer, a first data storage material layer, a first upper electrode layer and a first mask 39 may be sequentially stacked on the first conductive lines 9 and the gap-fill patterns 12. The first intermediate electrode layer may include a first intermediate conductive layer 23 and a second intermediate conductive layer 25 sequentially stacked, and the first upper electrode layer may include a first upper conductive layer 33 and a second upper conductive layer 36 sequentially stacked.

The first upper electrode layer and the first data storage material layer are etched by an etching process using the mask 39 as an etch mask, and thus, the first upper electrode patterns 30 and the first data storage material patterns 27 are formed. A lower spacer 146 is formed on side surfaces of the data storage material patterns 27, the first upper electrode patterns 30, and the mask 39, and the first intermediate electrode layer, the first switching material layer and the first lower electrode layer are etched by using the mask 39 and the lower spacer 146 as an etch mask, to form first intermediate electrode patterns 21, first switching material patterns 18 and the first lower electrode patterns 15.

Referring to FIGS. 1 and 16B, a surface treatment process 42d same as substantially similar to the first surface treatment process 42a of FIG. 13B may be performed.

By the first surface treatment process 42d, a first region 39d doped with an impurity element (e.g., nitrogen) in the first mask 39, a first region 36d 'in the second upper conductive layer 36, doped with the impurity element from the side of the second upper conductive layer 36, a first region 33d' in the first upper conductive layer 33, doped with the impurity element from the side surface of the first upper conductive layer 33, a first region 25d' in the second intermediate conductive layer 25, doped with the impurity element from the side surface of the second intermediate conductive layer 25, a first region 23d' in the first intermediate conductive layer 23, doped with the impurity element from the side surface of the first intermediate conductive layer 23, and a first region 15d' in the first lower electrode patterns 15, doped with the impurity element from the side surface of the first lower electrode patterns 15, may be formed. Accordingly, the first memory cell structures MC1b as described with reference to FIG. 9 may be formed.

Referring back to FIGS. 1 and 9, a lower capping layer 149 is conformally formed on a substrate having the lower spacer 146 and the first memory cell structures MC1b, and an insulating material layer is formed on the lower capping layer 149 to fill between the first memory cell structures MC1a. Further, the mask 39 of FIG. 16B is removed, and the insulating material layer is planarized until upper surfaces of the first upper electrode patterns 30 are exposed, thereby forming a lower interlayer insulating layer 151. Second conductive lines 154 may be formed on the first memory cell structures MC1b and the lower interlayer insulating layer 151. Second gap-fill patterns 157 may be formed on the second conductive lines 154.

The second memory cell structures MC2b described with reference to FIG. 9 may be formed on the second conductive lines 154 and the second gap-fill patterns 157 by the same method as that described with reference to FIGS. 16A and 16B.

In some example embodiments, the impurity element (e.g., nitrogen) is doped in a direction toward a central portion of the electrode pattern from a side of the electrode pattern, in an electrode pattern which may be formed of a carbon material layer or a carbon-containing material layer. For example, the first region (36d' in FIGS. 2, 3A and 3B) in contact with the first lower spacer (46 in FIGS. 2, 3A and 3B) may be formed in the second upper conductive layer (36 in FIGS. 2, 3A and 3B) of the first upper electrode pattern (30 in FIGS. 2, 3A and 3B). The first region (36d' in FIGS. 2, 3A and 3B) as described above may be formed by being doped with the impurity element (e.g., nitrogen) in a direction from the side (36s in FIG. 3C) of the second upper conductive layer (36 in FIGS. 2, 3A and 3B) toward the central portion (36c of FIG. 3C) of the upper conductive layer (36 in FIGS. 2, 3A and 3B). Interfacial adhesion between the first lower spacer 46 of FIGS. 2, 3A and 3B and the side of the second upper conductive layer 36 in FIGS. 2, 3A and 3B may be improved by the first region 36d' in FIGS. 2, 3A and 3B. Accordingly, defects due to peeling occurring between the side of the second upper conductive layer 36 of FIGS. 2, 3A and 3B and the first lower spacer 46 of FIGS. 2, 3A and 3B may be mitigated or prevented.

As set forth above, according to some example embodiments, an electrode pattern, which may be formed of a carbon material layer or a carbon-containing material layer, may include a first region doped with a nitrogen element. The first region in the electrode pattern may be formed by doping a nitrogen element from a side of the electrode pattern. The first region of the electrode pattern may improve adhesion to an insulating material in direct contact with the electrode pattern, such as a spacer or a capping layer.

According to some example embodiments, by providing an electrode pattern including the first region capable of improving adhesive force, a defect due to a peeling phenomenon occurring between the insulating material and the side surface of the electrode pattern may be mitigated or prevented.

While some example embodiments have been illustrated and described above, it will be apparent to those skilled in the art that modifications and variations could be made without departing from the scope of the present inventive concepts as defined by the appended claims.

What is claimed is:

1. A semiconductor device comprising:
a first conductive line extending on a substrate in a first horizontal direction, the first horizontal direction being parallel to a first upper surface of the substrate;
a second conductive line extending on the first conductive line in a second horizontal direction, the second horizontal direction being parallel to the first upper surface of the substrate and perpendicular to the first horizontal direction;
a first memory cell structure between the first conductive line and the second conductive line;
a lower interlayer insulating layer adjacent to a first side of the first memory cell structure;
a lower capping layer between the first memory cell structure and the lower interlayer insulating layer; and
a lower spacer between the lower capping layer and a portion of the first side of the first memory cell structure,
wherein the first memory cell structure includes a first lower electrode pattern, a first switching material pattern, a first intermediate electrode pattern, a first data storage material pattern, and a first upper electrode pattern that are sequentially stacked,
the first intermediate electrode pattern includes a first intermediate conductive layer and a second intermediate conductive layer that are sequentially stacked,
the first upper electrode pattern includes a first upper conductive layer and a second upper conductive layer that are sequentially stacked,
at least one of the first lower electrode pattern, the first intermediate conductive layer, or the second upper conductive layer includes a first material layer, the first material layer including at least one of a first carbon material layer or a first carbon-containing material layer, and the first material layer includes a first region doped with nitrogen and a second region that is not doped with the nitrogen or is doped with the nitrogen at a first concentration lower than a second concentration of the nitrogen in the first region.

2. The semiconductor device of claim 1, wherein the first lower electrode pattern, the first intermediate conductive layer, and the second upper conductive layer includes the first material layer, the first region of the first material layer is doped with the nitrogen in a direction from a second side of the first material layer toward a central portion of the first material layer, the second region of the first material layer is spaced apart from the second side of the first material layer, and the first material layer is the first carbon-containing material layer that is an alloy layer of carbon and metal.

3. The semiconductor device of claim 1, wherein the second upper conductive layer includes the first material layer, the first region of the first material layer is doped with the nitrogen in a direction from a second side of the first material layer toward a central portion of the first material layer, the second region of the first material layer is spaced apart from the second side of the first material layer, the first lower electrode pattern and the first intermediate conductive layer includes a second material layer, the second material layer includes at least one of a second carbon material layer that is not doped with the nitrogen or a second carbon-containing material layer that is not doped with the nitrogen, and the first carbon-containing material layer and the second carbon-containing material layer are alloy layers of carbon and metal.

4. The semiconductor device of claim 1, wherein the first material layer has a first width or a first diameter of a first size, and a second width or a second diameter of the second region of the first material layer is equal to or greater than one half of the first size.

5. The semiconductor device of claim 1, wherein the lower spacer and the first data storage material pattern are on a second upper surface of the first intermediate electrode pattern.

6. The semiconductor device of claim 5, further comprising:

an inner spacer between a third side of the upper electrode pattern and the lower spacer, wherein the inner spacer and the upper electrode pattern are on a third upper surface of the first data storage material pattern.

7. The semiconductor device of claim 5, wherein the lower capping layer includes a first portion extending between the lower interlayer insulating layer and the first memory cell structure, and a second portion extending from a bottom end of the first portion to cover a lower surface of the lower interlayer insulating layer.

8. The semiconductor device of claim 1, wherein the lower interlayer insulating layer comprises a first lower interlayer insulating layer below the second conductive line and a second lower interlayer insulating layer extending onto a fourth side of the second conductive line, the lower capping layer comprises a first lower capping layer below the second conductive line, and a second lower capping layer extending onto the fourth side of the second conductive line, and the lower spacer comprises a first lower spacer below the second conductive line, and a second lower spacer extending onto the fourth side of the second conductive line.

9. The semiconductor device of claim 1, further comprising:

a third conductive line on the second conductive line;

a second memory cell structure between the second conductive line and the third conductive line;

a second lower interlayer insulating layer adjacent a fifth side of the second memory cell structure;

a second capping layer between the second memory cell structure and the second lower interlayer insulating layer; and a second spacer between the second capping layer and the second memory cell structure, wherein the second memory cell structure includes a second lower electrode pattern, a second switching material pattern, a second intermediate electrode pattern, a second data storage material pattern, and a second upper electrode pattern that are sequentially stacked, and the second upper electrode pattern includes a same material as the first upper electrode pattern.

10. The semiconductor device of claim 1, wherein the first switching material pattern is an ovonic threshold switching device, the first data storage material pattern is a phase change material including at least one of tellurium (Te) or selenium (Se), and at least one of germanium (Ge), antimony (Sb), bismuth (Bi), lead (Pb), tin (Sn), arsenic (As), sulfur (S), silicon (Si), phosphorous (P), oxygen (O), or indium (In).

11. The semiconductor device of claim 1, wherein the first intermediate conductive layer has a first thickness greater than that of the second intermediate conductive layer, the first upper conductive layer has a second thickness less than that of the second upper conductive layer, and the second intermediate conductive layer and the first upper conductive layer includes tungsten.

12. The semiconductor device of claim 1, wherein the second conductive line comprises a third region doped with the nitrogen in a direction from a sixth side of the second conductive line toward a central portion of the second conductive line.

13. A semiconductor device comprising:

a first conductive line on a substrate;

a plurality of memory cell structures stacked on the first conductive line in a direction perpendicular to an upper surface of the substrate;

a second conductive line between the plurality of memory cell structures; and a third conductive line on an uppermost one of the plurality of memory cell structures, wherein each of the plurality of memory cell structures includes a data storage material pattern, a switching material pattern, and a plurality of electrode patterns, at least one of the plurality of electrode patterns includes at least one of a first carbon material layer or a first carbon-containing material layer, and the at least one of the plurality of electrode patterns includes a first region doped with a nitrogen and a second region that is not doped with the nitrogen, or is doped with the nitrogen at a first concentration lower than a second concentration of the nitrogen in the first region.

14. The semiconductor device of claim 13, wherein
at least one of the plurality of electrode patterns comprises a first conductive layer and a second conductive layer on the first conductive layer,
the second conductive layer has a thickness greater than that of the first conductive layer,
the first conductive layer includes tungsten, and
the second conductive layer includes at least one of a second carbon material layer or a second carbon-containing material layer.

15. The semiconductor device of claim 13, wherein the data storage material pattern is a phase change material including at least one of tellurium (Te) or selenium (Se), and at least one of germanium (Ge), antimony (Sb), bismuth (Bi), lead (Pb), tin (Sn), arsenic (As), sulfur (S), silicon (Si), phosphorous (P), oxygen (O), nitrogen (N) or indium (In).

16. The semiconductor device of claim 13, wherein the switching material pattern is an ovonic threshold switching device.

17. A semiconductor device comprising:
a first conductive line on a substrate;
a memory cell structure on the first conductive line;
a second conductive line on the memory cell structure;
an interlayer insulating layer adjacent to a side of the memory cell structure;
a capping layer between the memory cell structure and the interlayer insulating layer and covering a lower surface of the interlayer insulating layer; and
a spacer between the capping layer and a portion of the side of the memory cell structure,
wherein the memory cell structure includes a data storage material pattern, a switching material pattern, and a plurality of electrode patterns,
at least one of the plurality of electrode patterns includes at least one of a carbon material layer or a carbon-containing material layer, and
the at least one of the plurality of electrode patterns includes a first region doped with an impurity element and a second region that is not doped with the impurity element, or is doped with the impurity element at a first concentration lower than a second concentration of the impurity element in the first region.

18. The semiconductor device of claim 17, wherein the impurity element is nitrogen (N).

19. The semiconductor device of claim 17, wherein
at least another one of the plurality of electrode patterns comprises a metal layer differently from the at least one of the plurality of electrode patterns, and
the metal layer has a thickness less than that of the at least one of the plurality of electrode patterns.

20. The semiconductor device of claim 19, wherein the second conductive line comprises a third region doped with the impurity element.

* * * * *